(12) United States Patent
Sato et al.

(10) Patent No.: US 8,128,831 B2
(45) Date of Patent: Mar. 6, 2012

(54) PLASMA ETCHING METHOD AND COMPUTER-READABLE STORAGE MEDIUM

(75) Inventors: Manabu Sato, Nirasaki (JP); Yoshiki Igarashi, Nirasaki (JP); Yoshimitsu Kon, Nirasaki (JP); Masanobu Honda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/617,440

(22) Filed: Dec. 28, 2006

(65) Prior Publication Data
US 2007/0165355 A1    Jul. 19, 2007

Related U.S. Application Data

(60) Provisional application No. 60/760,923, filed on Jan. 23, 2006.

(30) Foreign Application Priority Data

Dec. 28, 2005 (JP) ................................. 2005-378608

(51) Int. Cl.
*H01L 21/302* (2006.01)
(52) U.S. Cl. ............... 216/41; 216/51; 216/64; 216/67; 438/725

(58) Field of Classification Search .................. 216/67
See application file for complete search history.

(56) References Cited

U.S. PATENT DOCUMENTS
5,110,438 A * 5/1992 Ohmi et al. ............ 204/298.34
(Continued)

FOREIGN PATENT DOCUMENTS
CN        1516535 A       7/2004
(Continued)

*Primary Examiner* — Anita Alanko
(74) *Attorney, Agent, or Firm* — Oblon, Spivak, McClelland, Maier & Neustadt, L.L.P.

(57) ABSTRACT

A plasma processing apparatus includes a first and a second electrode disposed to face each other in a processing chamber, the second electrode supporting a substrate; a first RF power supply for applying a first RF power of a higher frequency to the second electrode; a second RF power supply for applying a second RF power of a lower frequency to the second electrode; and a DC power source for applying a DC voltage to the first electrode. In a plasma etching method for etching a substrate by using the plasma processing apparatus, the first and the second radio frequency power are applied to the second electrode to convert a processing gas containing no CF-based gas into a plasma and a DC voltage is applied to the first electrode, to thereby etch an organic film or an amorphous carbon film on the substrate by using a silicon-containing mask.

16 Claims, 17 Drawing Sheets

U.S. PATENT DOCUMENTS

| | | | |
|---|---|---|---|
| 5,721,021 A * | 2/1998 | Tobe et al. | 427/570 |
| 6,074,569 A * | 6/2000 | Kiziloglu et al. | 216/62 |
| 6,284,149 B1 * | 9/2001 | Li et al. | 216/64 |
| 6,743,730 B1 * | 6/2004 | Sano | 438/706 |
| 6,744,212 B2 * | 6/2004 | Fischer et al. | 315/111.21 |
| 7,537,672 B1 * | 5/2009 | Koshiishi et al. | 156/345.47 |
| 7,740,737 B2 * | 6/2010 | Koshiishi et al. | 156/345.44 |
| 7,951,262 B2 * | 5/2011 | Koshiishi et al. | 156/345.44 |
| 2001/0031543 A1 * | 10/2001 | Ando et al. | 438/485 |
| 2001/0034137 A1 * | 10/2001 | Nambu | 438/725 |
| 2001/0035132 A1 * | 11/2001 | Kent et al. | 118/733 |
| 2002/0173160 A1 * | 11/2002 | Keil et al. | 438/717 |
| 2002/0182880 A1 * | 12/2002 | Zhu et al. | 438/724 |
| 2003/0129835 A1 | 7/2003 | Kholodenko et al. | |
| 2003/0162407 A1 * | 8/2003 | Maex et al. | 438/725 |
| 2004/0222189 A1 * | 11/2004 | Fischer | 216/67 |
| 2006/0037701 A1 | 2/2006 | Koshiishi et al. | |
| 2006/0037703 A1 | 2/2006 | Koshiishi et al. | |
| 2006/0037704 A1 * | 2/2006 | Iwata et al. | 156/345.48 |
| 2006/0066247 A1 | 3/2006 | Koshiishi et al. | |
| 2006/0219363 A1 * | 10/2006 | Matsumoto et al. | 156/345.47 |
| 2008/0020583 A1 * | 1/2008 | Ueda et al. | 438/717 |
| 2009/0242515 A1 * | 10/2009 | Honda et al. | 216/67 |
| 2009/0242516 A1 * | 10/2009 | Honda et al. | 216/71 |
| 2009/0275207 A1 * | 11/2009 | Honda et al. | 438/729 |
| 2010/0055911 A1 * | 3/2010 | Fujihara | 438/694 |
| 2010/0190350 A1 * | 7/2010 | Yatsuda et al. | 438/710 |
| 2010/0213162 A1 * | 8/2010 | Mochiki et al. | 216/17 |
| 2010/0224587 A1 * | 9/2010 | Mukawa | 216/13 |

FOREIGN PATENT DOCUMENTS

| | | |
|---|---|---|
| EP | 1 193 746 A1 | 4/2002 |
| JP | 9-326383 | 12/1997 |

* cited by examiner

PLASMA ETCHING METHOD AND COMPUTER-READABLE STORAGE MEDIUM

FIELD OF THE INVENTION

The present invention relates to a plasma etching method for performing a plasma etching process on a substrate to be processed such as a semiconductor substrate or the like and a computer-readable storage medium containing a program for controlling a plasma processing apparatus to perform the plasma etching method.

BACKGROUND OF THE INVENTION

In manufacturing, e.g., semiconductor devices, a plasma etching process is frequently performed on a semiconductor wafer as a target substrate, wherein the semiconductor wafer is plasma-etched by using a resist as a mask to form a desired pattern in a layer formed on the semiconductor wafer.

As for a plasma etching apparatus for performing such a plasma etching process, there are used many different kinds of plasma etching apparatuses and a capacitively coupled parallel flat type plasma processing apparatus is a typical one most commonly used among them.

In the capacitively coupled parallel flat type plasma etching apparatus, a pair of parallel flat electrodes (an upper and a lower electrode) is provided in a chamber, and a processing gas is introduced into the chamber. Further, a radio frequency electric field is formed between the electrodes by applying a radio frequency power to one of the electrodes, so that a plasma of the processing gas is generated by the radio frequency electric field to plasma-etch a layer of a semiconductor wafer.

Specifically, there has been known a plasma etching apparatus wherein a radio frequency power for generating plasma is applied to an upper electrode to generate a plasma and a radio frequency power for attracting ions is applied to a lower electrode to convert the plasma into an appropriate plasma state. With such a plasma etching apparatus, a highly reproducible etching process can be performed with a high selectivity (see, e.g., Japanese Laid-open Patent Publication No. 2000-173993: Reference 1).

In case an organic material film is etched by using an inorganic material film as a mask by employing the capacitively coupled parallel flat type plasma etching apparatus, a radio frequency power having a frequency of 50 to 150 MHz is known to be applied to a lower electrode in order to etch the organic material film at a high etching rate and at a high etching selectivity with respect to the inorganic material film (see, e.g., Japanese Laid-open Patent Publication No. 2003-234331: Reference 2)

However, in the aforementioned technique of Reference 2, if a higher radio frequency power is applied to the lower electrode in order to etch the organic material film at a higher etching rate, a shoulder portion of the inorganic material film may be damaged (shoulder loss), which makes it impossible to obtain a high etching selectivity.

SUMMARY OF THE INVENTION

It is, therefore, an object of the present invention to provide a plasma etching method capable of etching an organic film or an amorphous carbon film on a target substrate by using a mask including silicon at a high etching rate and with a high etching selectivity.

In accordance with a first aspect of the invention, there is provided a plasma etching method for etching a substrate by using a plasma processing apparatus including an evacuable processing chamber accommodating therein the substrate; a first and a second electrode disposed to face each other in the processing chamber, the second electrode supporting the substrate; a first radio frequency power supply unit for applying a first radio frequency power of a higher frequency to the second electrode; a second radio frequency power supply unit for applying a second radio frequency power of a lower frequency to the second electrode; a DC power source for applying a DC voltage to the first electrode; and a processing gas supply unit for supplying a processing gas into the processing chamber, the method including the step of: etching an organic film or an amorphous film on the substrate by using a silicon-containing mask wherein the first and the second radio frequency power are applied to the second electrode to convert a processing gas supplied from the processing gas supply unit into a plasma, the processing gas containing no CF-based gas, and a DC voltage is applied to the first electrode.

In this case, as the processing gas containing no CF-based gas, one of $O_2$ gas and a gaseous mixture of $(O_2, N_2)$, $(O_2, N_2, CO)$, $(O_2, CO)$, $(O_2, CO_2)$, $(O_2, CH_4)$ or $(O_2, NH_3)$ may be used. Further, the DC voltage from the DC power source is preferably to be within a range from $-100$ V to $-1500$ V, more preferably from $-100$ V to $-1000$ V, most preferably from $-100$ V to $-600$ V. Moreover, the first electrode is preferably DC-floated with respect to a ground potential.

In accordance with a second aspect of the present invention, there is provided a computer-readable storage medium storing therein a control program, wherein the control program controls a plasma processing apparatus to perform the plasma etching method of the first aspect of the present invention.

In accordance with the present invention, it is possible to etch an organic film or an amorphous carbon film on the substrate by using a silicon-containing mask at a high etching rate and with a high etching selectivity.

BRIEF DESCRIPTION OF THE DRAWINGS

The above and other objects and features of the present invention will become apparent from the following description of preferred embodiments, given in conjunction with the accompanying drawings, in which:

FIG. 16A is a schematic cross-sectional view of the wafer which is undergoing a process of an etching method in accordance with the present invention;

FIG. 16B is a schematic cross-sectional view of the wafer which is undergoing a process of an etching method in accordance with the present invention;

FIG. 16C is a schematic cross-sectional view of the wafer which is undergoing a process of an etching method in accordance with the present invention;

DETAILED DESCRIPTION OF THE PREFERRED EMBODIMENTS

Hereinafter, preferred embodiments of the present invention will be described in detail with reference to the accompanying drawings.

Figure 1:
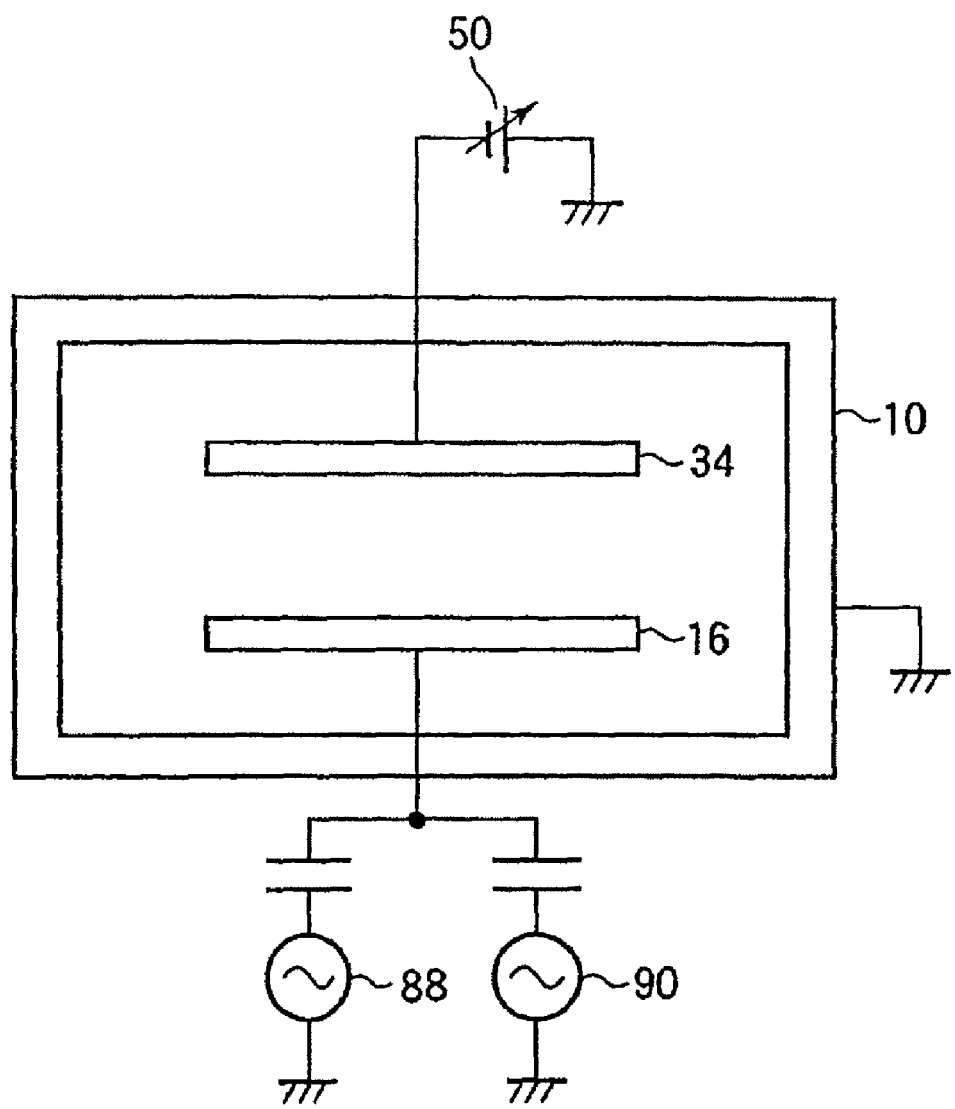
FIG. 1 is a schematic diagram of a plasma etching apparatus in accordance with an embodiment of the present invention.

FIG. 1 is a schematic diagram of a plasma etching apparatus in accordance with a preferred embodiment of the present invention.

The plasma etching apparatus is a type of applying two radio frequency (RF) powers of different frequencies to a lower electrode wherein a RF power of, e.g., 40 MHz for generating a plasma is applied from a first RF power supply 88 to a susceptor 16 serving as the lower electrode while another RF power of, e.g., 2 MHz for attracting ions is applied from a second RF power supply 90 to the susceptor 16. Further, as shown in FIG. 1, a variable DC power source 50 is connected to an upper electrode 34 to apply a DC voltage to the upper electrode 34. The plasma etching apparatus will now be described in further detail with reference to FIG. 2.

The plasma etching apparatus is a capacitively coupled parallel flat type plasma etching apparatus having an approximately cylindrical chamber (processing chamber) 10 made of aluminum whose surface is anodically oxidized. The chamber 10 is frame grounded.

A columnar susceptor support 14 is provided on a bottom of the chamber 10 via an insulating plate 12 made of ceramic or the like. The susceptor 16 made of, e.g., aluminum is installed on the susceptor support 14. The susceptor 16 serves as the lower electrode, and a semiconductor wafer W as a substrate to be processed is mounted thereon.

Provided on top of the susceptor 16 is an electrostatic chuck 18 for adsorptively holding the semiconductor wafer W with the help of an electrostatic force. The electrostatic chuck 18 has a structure in which an electrode 20 made of a conductive film is sandwiched between a pair of insulating layers or sheets. A DC power supply 22 is electrically connected to the electrode 20. Further, the semiconductor wafer W is adsorptively held on the electrostatic chuck 18 by the electrostatic force such as Coulomb force or the like generated by a DC voltage from the DC power supply 22.

A focus ring (correction ring) 24 made of, e.g., silicon is provided on a top surface of the susceptor 16 around the electrostatic chuck 18 (the semiconductor wafer W) in order to improve an etching uniformity. A cylindrical inner wall member 26 made of, e.g., quartz is provided on lateral surfaces of the susceptor 16 and the susceptor support 14.

An annular coolant passageway 28 is formed inside the susceptor support 14. A coolant, e.g., a cooling water, kept at a specific temperature is supplied from a chiller unit (not shown) installed at an outside into the coolant passageway 28 through lines 30a and 30b to be circulated therein so that a processing temperature of the semiconductor wafer W on the susceptor can be controlled by using the coolant.

Moreover, a thermally conductive gas, e.g., He gas, is supplied from a thermally conductive gas supply unit (not shown) into a gap formed between the top surface of the electrostatic chuck 18 and the bottom surface of the semiconductor wafer W through a gas supply line 32.

The upper electrode 34 is installed above the susceptor 16 serving as the lower electrode so as to face the susceptor 16 in parallel thereto. Furthermore, a space between the upper and the lower electrode becomes a plasma generation region. The upper electrode 34 has a facing surface, i.e., a surface being in contact with the plasma generation region while facing the semiconductor wafer W on the susceptor 16 serving as the lower electrode.

The upper electrode 34 is supported by an insulating shield member 42 at the upper portion of the chamber 10. The upper electrode 34 includes an electrode plate 36 and a water-cooled electrode holder 38. The electrode plate 36 forms the surface facing the susceptor 16, and has a plurality of gas injection holes 37. The electrode holder 38 holds the electrode plate 36 such that it can be freely attached thereto and detached therefrom. The electrode holder 38 is made of a conductive material, e.g., aluminum, and the surface thereof is anodically oxidized. Preferably, the electrode plate 36 is a conductor or semiconductor of a low resistance with low Joule heat. Meanwhile, for the purpose of strengthening a resist, as will be described later, the electrode plate 36 is preferably made of a silicon-containing material. Thus, the electrode plate 36 is preferably made of silicon or SiC. A gas diffusion space 40 is provided in the electrode holder 38. A plurality of gas flow holes 41 extends downwardly from the gas diffusion space 40 to communicate with the gas injection holes 37.

In the electrode holder 38, there is formed a gas introduction opening 62 for introducing a processing gas into the gas diffusion space 40. A gas supply line 64 is connected to the gas introduction opening 62, and a processing gas supply source 66 is connected to the gas supply line 64. A mass flow controller (MFC) 68 and a closable/openable valve 70 are sequentially provided from the upstream side in the gas supply line 64. Further, a processing gas for etching, which is fed from the processing gas supply source 66, flows through the gas supply line 64 into the gas diffusion space 40. The processing gas flows through the gas flow holes 41 and the gas injection holes 37 to be injected into the plasma generating space in the form of a shower. That is, the upper electrode 34 serves as a shower head for supplying the processing gas.

The variable DC power source 50 is electrically connected to the upper electrode 34 via a low pass filter (LPF) 48. The variable DC power source 50 may be a bipolar power source. The power feed of the variable DC power source 50 can be controlled by an on/off switch 52. The polarity, current and voltage of the variable DC power source 50 and the on/off operation of the on/off switch 52 are controlled by a controller (control unit) 51.

The low pass filter (LPF) 48 serves to trap a RF power from the first and the second RF power supply, and preferably includes an LR filter or an LC filter.

A sidewall of the chamber 10 upwardly extends to a position higher than the upper electrode 34 to form a cylindrical grounding conductor 10a. The cylindrical grounding conductor 10a has an upper ceiling wall.

The first RF power supply 88 is electrically connected via a matching unit 87 to the susceptor 16 serving as the lower electrode. Further, a second RF power supply 90 is electrically connected via a matching unit 89 to the susceptor 16. The first RF power supply 88 outputs a RF power of a frequency of 27 MHz or greater, e.g., 40 MHz. The second RF power supply 90 outputs a RF power of a frequency of 13.56 MHz or less, e.g., 2 MHz.

The matching units 87, 89 match the load impedances to internal (or output) impedances of the first and the second RF power supply 88, 90, respectively. When a plasma is generated in the chamber 10, the matching units 87, 89 make the internal impedances of the first and the second RF power supply 88, 90 be seemingly matched to the respective load impedances.

A gas exhaust port 80 is provided at a bottom of the chamber 10, and a gas exhaust unit 84 is connected to the gas exhaust port 80 via a gas exhaust line 82. The gas exhaust unit 84 includes a vacuum pump such as a turbo-molecular pump, and can depressurize the inside of the chamber 10 to a desired vacuum level. Further, a loading/unloading opening 85, through which the semiconductor wafer W is loaded and unloaded, is provided in the sidewall of the chamber 10. The loading/unloading opening 85 can be opened and closed by a gate valve 86. Further, a deposition shield 11 is mounted to the inner wall of the chamber 10 so as to prevent an etching byproduct (deposition) from being attached to the chamber 10, wherein the deposition shield 11 is freely attachable to the inner wall of the chamber 10 and freely detachable therefrom. That is, the deposition shield 11 serves as a chamber wall. The deposition shield 11 is also provided on the outer surface of the inner wall member 26. A gas exhaust plate 83 is provided at a lower portion of the chamber 10 between the deposition shield 11 mounted to the inner wall of the chamber 10 and the deposition shield 11 around the inner wall member 26. The deposition shields 11 and the gas exhaust plate 83 may be formed by coating an aluminum material with ceramic such as $Y_2O_3$.

A conductive member (GND block) 91, which is DC-connected to a ground, is provided at the same height level as the wafer W on the deposition shield 11 serving as the inner wall of the chamber. The conductive member has an abnormal-discharge prevention effect as will be described later.

Each component of the plasma etching apparatus is connected to a process controller (general control unit) 95 to be controlled by the process controller 95. A user interface 96 having a keyboard, a display and the like is connected to the process controller 95. A process operator uses the keyboard when inputting commands to manage the plasma etching apparatus. The display is used to display the operational status of the plasma etching apparatus.

Further, a storage unit 97 is connected to the process controller 95, wherein the storage unit stores control programs for executing various processes performed in the plasma etching apparatus under the control of the process controller 95 and programs or recipes for operating each component of the plasma etching apparatus depending on the processing conditions. The recipes may be stored in a hard disk or a semiconductor memory, or may be set in the storage unit 97 through a computer-readable storage medium such as a CD-ROM, a DVD and the like.

If necessary, the operator selects a recipe from the storage unit 97 by using the user interface 96 to be executed by the process controller 95, so that a desired processing can be performed in the plasma etching apparatus under the control of the process controller 95. The plasma processing apparatus (plasma etching apparatus) described in this embodiment includes the process controller 95.

When the etching process is performed in the plasma etching apparatus constructed as described above, the gate valve 86 is first opened, and the semiconductor wafer W to be etched is loaded through the loading/unloading opening 85 into the chamber 10 to be mounted on the susceptor 16. Further, a processing gas for etching is supplied from the processing gas supply source 66 into the gas diffusion space 40 at a predetermined flow rate. The processing gas is supplied through the gas flow holes 41 and the gas injection holes 37 into the chamber 10 while the chamber 10 being evacuated by the gas exhaust device 84, so that the pressure in the chamber 10 is maintained to be within, e.g., a range from 0.1 to 150 Pa. As for a processing gas, various conventional processing gases can be employed. For example, a halogen element-containing gas such as a fluorocarbon gas ($C_xF_y$), e.g., $C_4F_8$ gas, may be properly used and other gases such as Ar gas, $O_2$ gas or the like may also be added thereto.

In a state where the etching gas is introduced into the chamber 10 as described above, a RF power of a specified magnitude for generating plasma is applied from the first RF power supply 88 to the susceptor 16 serving as the lower electrode, and a RF power of a specified magnitude for attracting ions is applied from the second RF power supply 90 to the susceptor 16. Further, a DC voltage is applied from the variable DC power source 50 to the upper electrode 34. Furthermore, by applying a DC voltage from the DC power supply 22 to the electrode 20 of the electrostatic chuck 18, the semiconductor wafer W is fixedly held on the susceptor 16.

The processing gas, which has been injected through the gas injection holes 37 formed in the electrode plate 36 of the upper electrode 34, is converted into a plasma by a glow discharge that is generated between the upper electrode 34 and the susceptor 16 serving as the lower electrode due to the radio frequency powers. A target surface of the semiconductor wafer W is etched by radicals and/or ions generated in such plasma.

In such plasma etching apparatus, since a RF power of a high frequency regime (e.g., 10 MHz or above) is supplied from the first RF power supply 88 to the susceptor 16 serving as the lower electrode, it is possible to form a high density plasma in a desirable state. Accordingly, the high density plasma can also be formed under a lower pressure condition.

In the present embodiment, when the plasma is generated as described above, a DC voltage of a specific polarity and magnitude is applied from the variable DC power source 50 to the upper electrode 34. At this time, the voltage applied from the variable DC power source 50 is preferably controlled by the controller 51 such that the magnitude of a self bias voltage $V_{dc}$ on the surface of the upper electrode 34 or the surface of the electrode plate 36 becomes greater, i.e., the absolute value of the self bias voltage $V_{dc}$ on the surface of the upper electrode 34 is increased to the extent that a predetermined sputter effect can be realized in the surface of the upper electrode 34 or the surface of the electrode plate 36. In case the plasma is generated by the application of a RF power from the first RF power supply 88, an amount of a polymer may be attached to the upper electrode 34. However, by applying a proper DC voltage from the variable DC power source 50 to the upper electrode 34, the polymer attached thereto can be sputtered, thereby cleaning the surface of the upper electrode 34. Further, an optimum amount of polymer can be supplied to the semiconductor wafer W, thus preventing a surface roughness of a photoresist film. Moreover, the upper electrode 34 itself can be made to sputter by adjusting the voltage from the variable DC power source 50 to supply the electrode material to the surface of the semiconductor wafer W, so that an amount of carbide is formed on the surface of the photoresist film to strengthen the photoresist film. Further, the electrode material sputtered reacts with F in the fluorocarbon-based processing gas to be exhausted, so that the ratio of F in the plasma is decreased, thereby making it difficult to etch the photoresist film. In case the electrode plate 36 is formed of silicon or a silicon-containing material such as SiC, silicon sputtered from the surface of the electrode plate 36 reacts with polymer to form SiC on the surface of the photoresist film, so that the photoresist film becomes very strong. Since Si is most likely to react with F, the above effects become further enhanced. Accordingly, the material of the electrode plate 36 is preferably to be a silicon-containing material. In this case, in place of controlling the voltage applied from the variable DC power source 50, the current or power applied may be controlled.

Figure 3A:
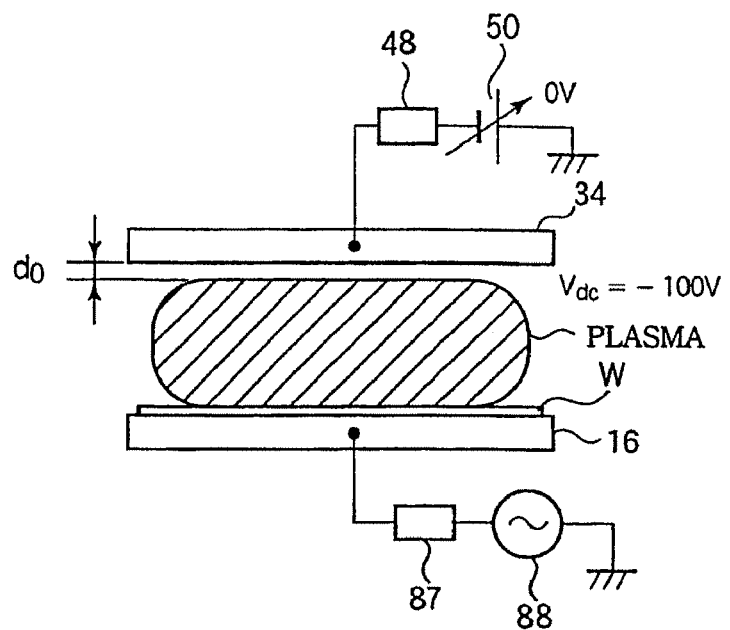
FIG. 3A provides a schematic diagram illustrating changes in Vdc and plasma sheath when a DC voltage is applied to an upper electrode in the plasma etching apparatus shown in FIG. 2.
Figure 3B:
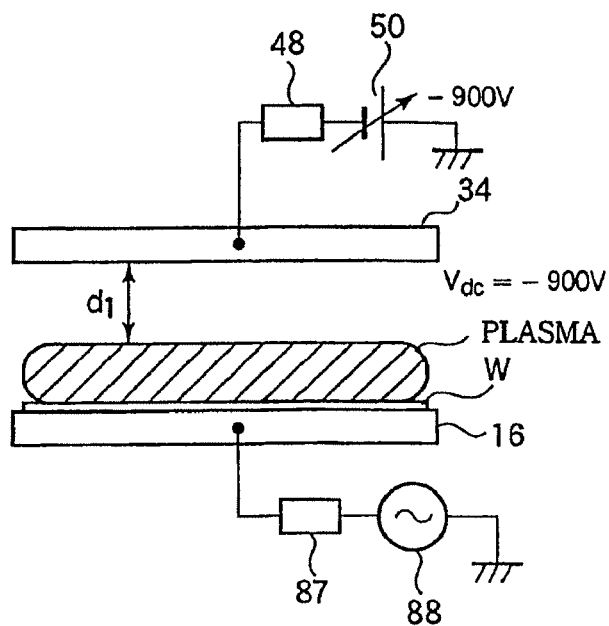
FIG. 3B provides a schematic diagram illustrating changes in Vdc and plasma sheath when a DC voltage is applied to an upper electrode in the plasma etching apparatus shown in FIG. 2.
Figure 4A:
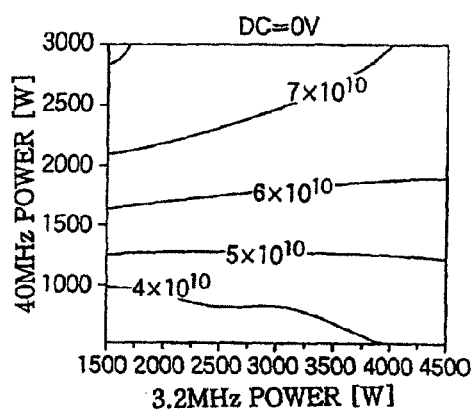
FIG. 4A presents a graph showing variations in an electron density when the DC voltage applied to the upper electrode is changed under HARC etching conditions in the plasma etching apparatus shown in FIG. 2.
Figure 4B:
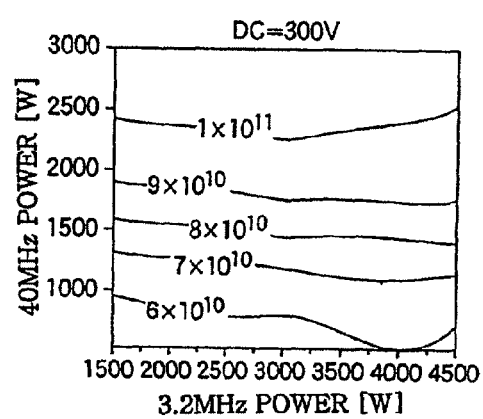
FIG. 4B presents a graph showing variations in an electron density when the DC voltage applied to the upper electrode is changed under HARC etching conditions in the plasma etching apparatus shown in FIG. 2.
Figure 4C:
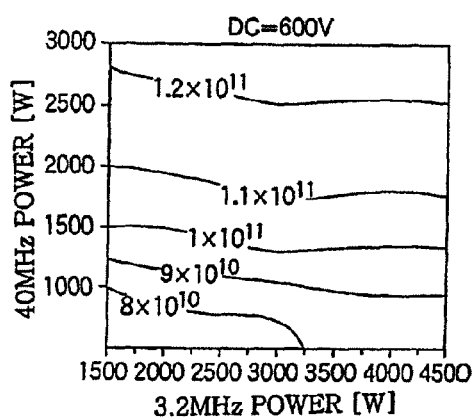
FIG. 4C presents a graph showing variations in an electron density when the DC voltage applied to the upper electrode is changed under HARC etching conditions in the plasma etching apparatus shown in FIG. 2.
Figure 4D:
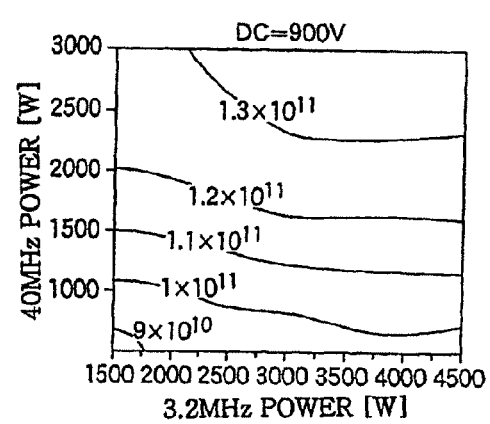
FIG. 4D presents a graph showing variations in an electron density when the DC voltage applied to the upper electrode is changed under HARC etching conditions in the plasma etching apparatus shown in FIG. 2.
Figure 5A:
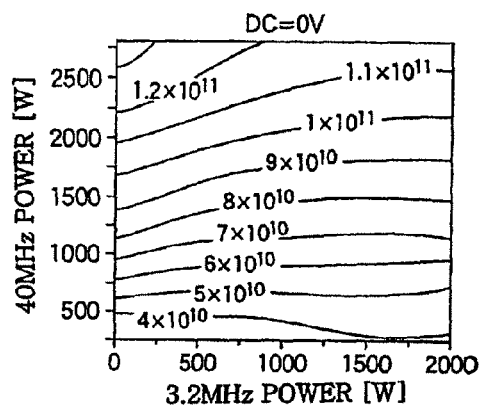
FIG. 5A describes a graph showing variations in an electron density when the DC voltage applied to the upper electrode is changed under via etching conditions in the plasma etching apparatus shown in FIG. 2.
Figure 5B:
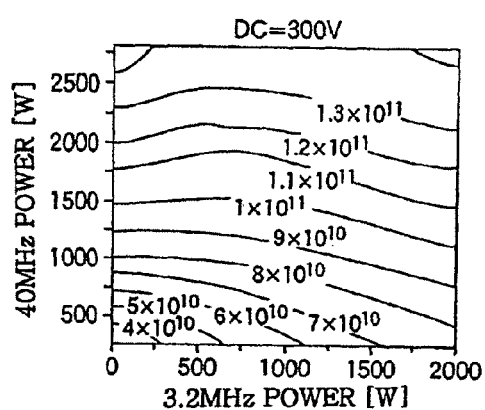
FIG. 5B describes a graph showing variations in an electron density when the DC voltage applied to the upper electrode is changed under via etching conditions in the plasma etching apparatus shown in FIG. 2.
Figure 5C:
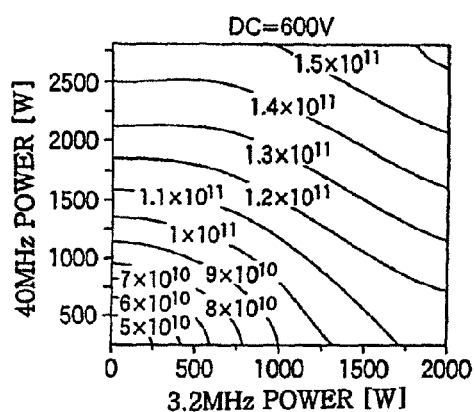
FIG. 5C describes a graph showing variations in an electron density when the DC voltage applied to the upper electrode is changed under via etching conditions in the plasma etching apparatus shown in FIG. 2.
Figure 5D:
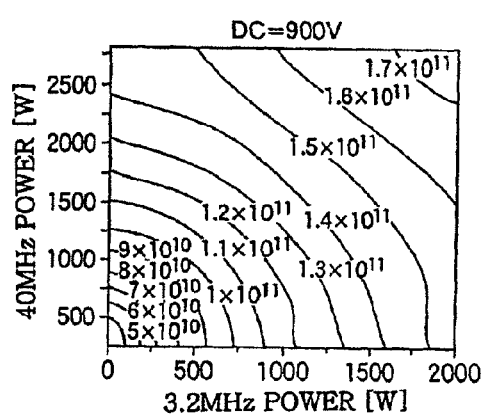
FIG. 5D describes a graph showing variations in an electron density when the DC voltage applied to the upper electrode is changed under via etching conditions in the plasma etching apparatus shown in FIG. 2.

In case a DC voltage is applied to the upper electrode 34 and the magnitude of the self bias voltage $V_{dc}$ becomes increased, the thickness of the plasma sheath formed on the side of the upper electrode 34 is increased as shown in FIGS. 3A and 3B. Further, as the thickness of the plasma sheath is increased, the size of the plasma is decreased. For example, when no DC voltage is applied to the upper electrode 34, $V_{dc}$ of the upper electrode 34 is, e.g., −100 V and the plasma sheath has a thinner thickness $d_0$ as shown in FIG. 3A. On the other hand, when a DC voltage of −900 V is applied to the upper electrode 34, $V_{dc}$ of the upper electrode 34 becomes, e.g., −900 V. In this case, as the thickness of the plasma sheath is proportional to ¾ of the absolute value of $V_{dc}$, the plasma sheath has a thicker thickness $d_1$ and the size of the plasma is decreased as shown in FIG. 3B. As described above, by forming a thick plasma sheath to appropriately decrease the size of the plasma, an effective residence time thereof on the semiconductor wafer W is reduced and the plasma is concentrated on the wafer W to suppress the diffusion thereof, so that the dissociation area is decreased. In this way, the dissociation of the fluorocarbon-based processing gas is suppressed, thereby making it difficult for the photoresist film to be etched. Accordingly, the voltage applied from the variable DC power source 50 is preferably controlled by the controller 51 such that the thickness of the plasma sheath on the side of the upper electrode 34 is increased to the extent that a plasma of a size reduced as desired is formed. Also in this case, in place of controlling the voltage applied from the variable DC power source 50, the current or power applied may be controlled.

Further, when the plasma is formed, electrons are generated near the upper electrode 34. If a DC voltage from the variable DC power source 50 is applied to the upper electrode 34, the electrons are vertically accelerated by a potential difference between the applied voltage and the potential of the plasma. By properly adjusting the polarity, the voltage value and the current value of the variable DC power source 50, the electrons are irradiated to the semiconductor wafer W. The irradiated electrons reform the composition of the photoresist film serving as a mask to strengthen the photoresist film. Accordingly, by controlling the amount of the electrons generated near the upper electrode 34 by the applied voltage value and the applied current value of the variable DC power source 50 and by further controlling the acceleration voltage of the electrons to the wafer W, the photoresist film can be strengthened.

In particular, in case the photoresist film on the semiconductor wafer W is a photoresist film for an ArF excimer laser (193 nm wavelength) (hereinafter, referred to as "ArF resist film"), the polymer structure of the ArF resist film is converted to the one shown in the right side of Chemical Equation (3) through the reactions shown in Chemical Equations (1) and (2) as follows. That is, as shown in "d" part of Chemical Equation (3), the composition of the ArF resist film is reformed (cross-link reaction of resist). The "d" part acts to make etching-resistance (plasma-resistance) significantly great, so that the etching-resistance of the ArF resist film is considerably increased. Accordingly, it is possible to suppress the surface roughness of the ArF resist film and to increase the etching selectivity of a target layer to the ArF resist film.

(Chemical Equations)

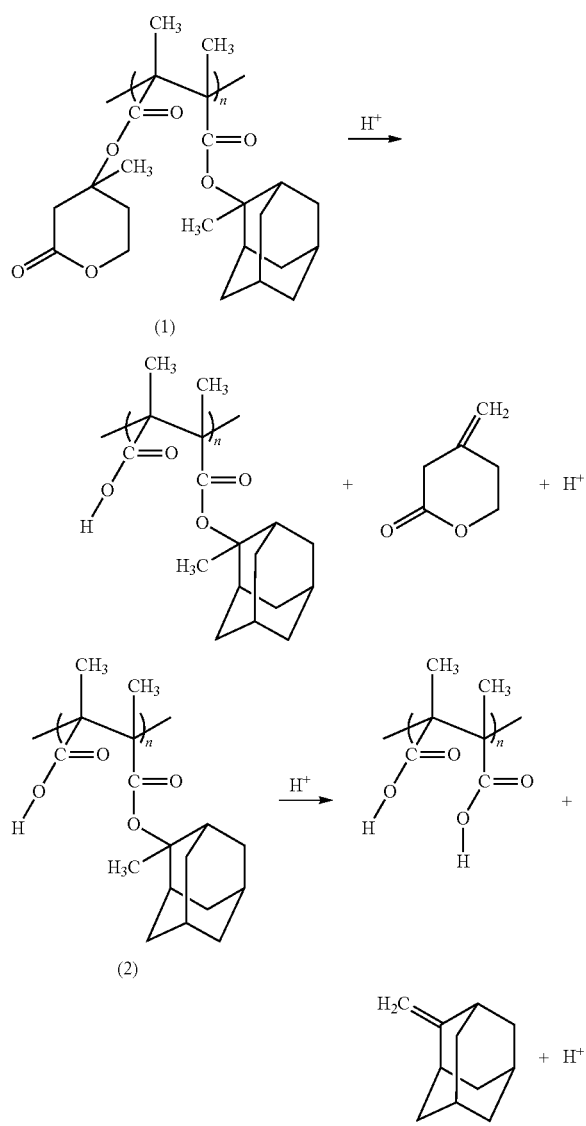

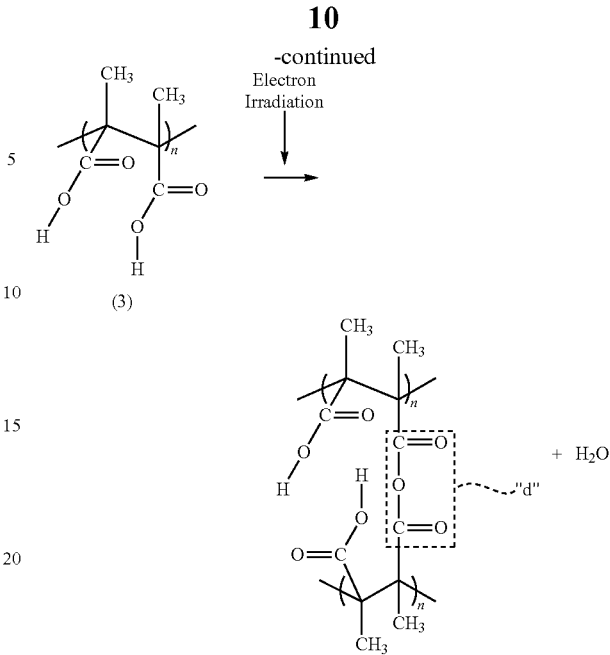

Accordingly, the voltage value and the current value applied from the variable DC power source 50 are preferably controlled by the controller 51 such that the etching-resistance of the photoresist film (particularly, ArF resist film) becomes increased by the irradiation of the electrons.

Further, as described above, if a DC voltage is applied to the upper electrode 34, the electrons generated near the upper electrode 34 upon the formation of the plasma are vertically accelerated; however, by properly adjusting the polarity, the voltage value and the current value of the variable, it is possible to make the electrons reach the inside of the holes of the semiconductor wafer W, to obtain a good processing shape with no bowing portion by suppressing the shading effect, and to attain a good uniformity of the processing shape.

In case electron current amount $I_{DC}$ by a DC voltage is used to express the amount of the electrons incident on the wafer W with the acceleration voltage of the electrons controlled, if the current amount of ions incident on the wafer from plasma is indicated by $I_{ion}$, it is preferred to satisfy the relationship of $I_{DC} > (\frac{1}{2})I_{ion}$. $I_{ion} = Z\rho V_{ion}e$ (where, Z: charge number, $\rho$: current density, $V_{ion}$: ion velocity, e: electron charge $1.6\times10^{-19}$ C). $I_{ion}$ is proportional to Ne since $\rho$ is proportional to Ne.

As described above, by controlling the DC voltage applied to the upper electrode 34, the sputtering function of the upper electrode 34, the function of reducing the size of the plasma, and a function of supplying a large amount of electrons generated at the upper electrode 34 to the semiconductor wafer W can be achieved, which in turn facilitates the strengthening of the photoresist film, the supply of an optimal polymer and the dissociation suppression of the processing gas, thereby making it possible to suppress the surface roughness of the photoresist film and to increase the etching selectivity of a target layer to the photoresist film. Further, it is possible to suppress CD (critical dimension) of the openings in the photoresist film from being enlarged, thereby forming a more precise pattern. Particularly, by controlling the DC voltage such that the sputtering function, the plasma reduction function and the electron supply function are properly realized, such effects can be further enhanced.

Further, which one of the aforementioned functions will dominate will be dependent on the processing conditions or the like. The voltage applied from the variable DC power source 50 is preferably controlled by the controller 51 such that at least one of the aforementioned functions is realized to efficiently achieve the above effects.

Moreover, the plasma potential can be controlled by adjusting the DC voltage applied to the upper electrode 34. Therefore, there is provided a function of suppressing an attachment of etching byproducts to the upper electrode 34, the deposition shield 11 forming the chamber wall, the inner wall member 26 or the insulating shield member 42.

If the etching byproducts are attached to the upper electrode 34, the deposition shield 11 forming the chamber wall or the like, the process characteristics may be changed or particles may be generated. Particularly, in case multi-layered films are continuously etched, for example, in case a Si-based organic film (SiOC), a SiN film, a SiO2 film and a photoresist film sequentially laminated on the semiconductor wafer W are continuously etched, there develops a memory effect such that a remaining affect of a previous processing adversely influences a next processing.

Such attachment of the etching byproducts is influenced by a difference between the plasma potential and the potential of the upper electrode 34, the chamber wall or the like, so that the attachment of the etching byproducts can be suppressed by controlling the plasma potential.

As described above, the plasma potential can be decreased by controlling the voltage applied from the variable DC power source 50 to the upper electrode 34, thereby suppressing the attachment of the etching byproducts to the upper electrode 34, the deposition shield 11 forming the chamber wall and the insulation members 26, 42 in the chamber 10. The value of the plasma potential Vp is preferably within a range of $80\ V \leq Vp \leq 200\ V$.

Furthermore, as another effect by the application of a DC voltage to the upper electrode 34, a plasma is generated by the DC voltage applied so that the density of the plasma is increased to thereby increase the etching rate.

This is because, if a minus DC voltage is applied to the upper electrode, the electrons are difficult to enter the upper electrode, thereby suppressing the reduction of the electrons; and, if ions are accelerated to enter the upper electrode, electrons can be ejected from the electrode, wherein the electrons are accelerated by the difference between the plasma potential and the applied voltage value to electrolytically dissociate a neutral gas (convert the neutral gas into a plasma), thereby increasing the electron density (plasma density).

This will be described based on experimental results thereof.

Figure 6:
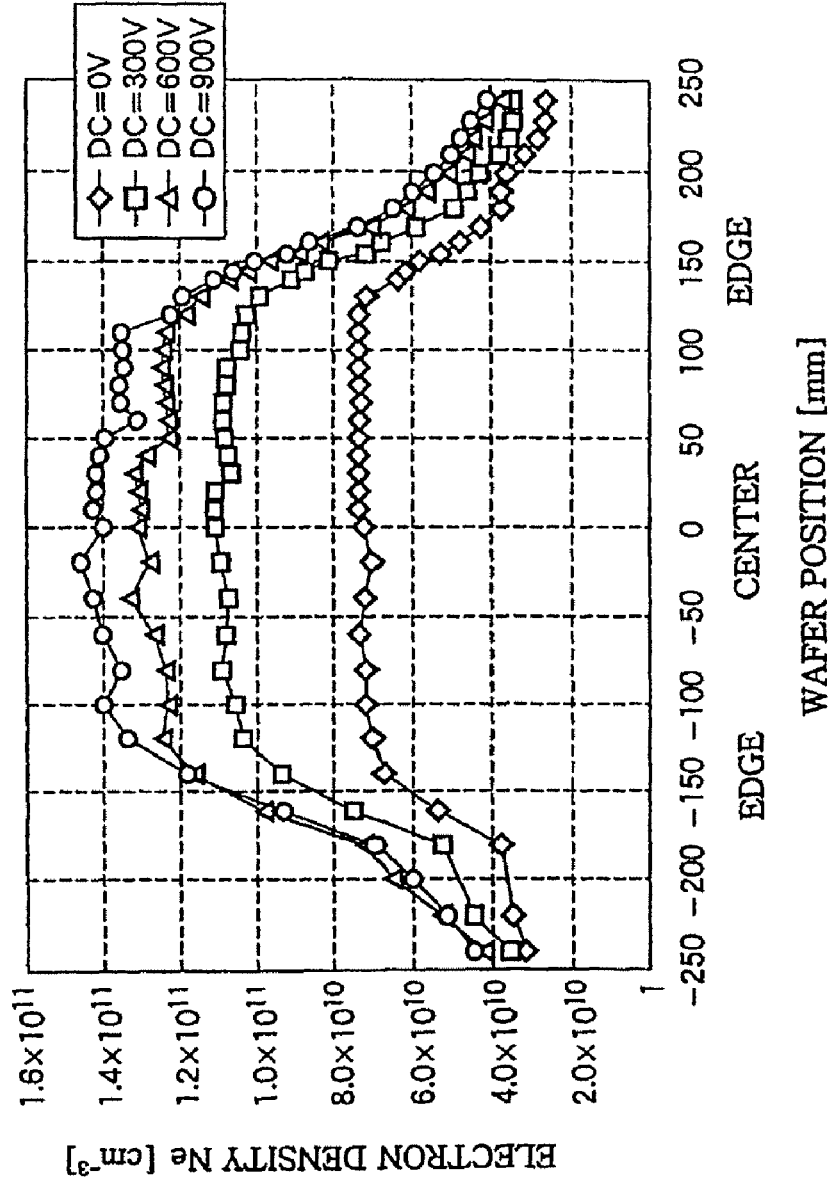
FIG. 6 offers a graph showing a distribution of the electron density in a diameter direction of a wafer when a first and a second radio frequency power are respectively set to 3000 W and 4000 W in the above HARC etching.

FIGS. 4A to 4D show the relationship of radio frequency power outputs and electron density distributions when the absolute values of the minus DC voltage applied to the upper electrode are respectively set to be 0 V, 300 V, 600 V and 900 V under an HARC (high aspect ratio contact) etching condition that the frequencies of the first and the second RF power applied to the susceptor 16 serving as the lower electrode are respectively set to 40 MHz and 3.2 MHz, and the pressure is set to 4 Pa. Further, FIGS. 5A to 5D show the relationship of radio frequency power outputs and electron density distributions when the absolute values of the minus DC voltage applied to the upper electrode are respectively set to be 0 V, 300 V, 600 V and 900 V in the same manner as that of FIGS. 4A to 4D under a Via etching condition that the frequencies of the first and the second RF power applied to the susceptor 16 serving as the lower electrode are respectively set to 40 MHz and 3.2 MHz, and the pressure is set to 6.7 Pa. As shown in these drawings, it has been found that the electron density (plasma density) becomes greater as the absolute value of the applied DC voltage is increased. FIG. 6 shows the electron density distributions in a wafer diameter direction in a case where the first and the second RF power are respectively set to 3000 W and 4000 W under the above HARC condition. As can be seen from FIG. 6, the electron density becomes greater as the absolute value of the applied DC voltage is increased.

Further, by applying a DC voltage from the variable DC power source 50 to the upper electrode 34 when a plasma is generated, it is possible to increase the plasma density in the central portion particularly upon a trench etching. In case the pressure in the chamber 10 is high and a minus gas is used as the etching gas as similar to the condition of the trench etching, the plasma density in the central portion in the chamber 10 tends to be decreased. However, by applying a DC voltage to the upper electrode 34 to increase the plasma density in the central portion as described above, it is possible to control the plasma density such that it becomes uniform.

This will be described based on experimental results thereof.

Figure 2:
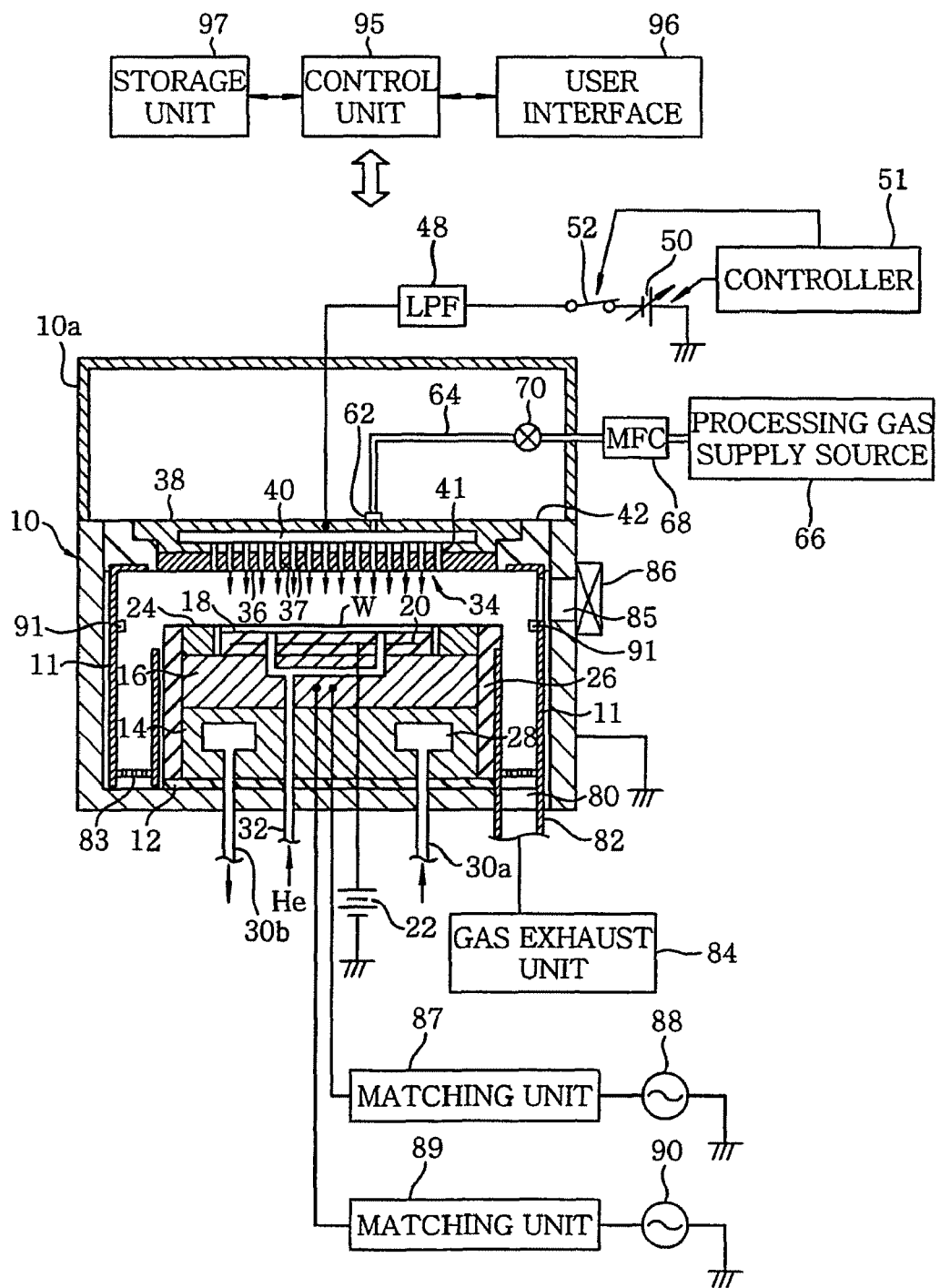
FIG. 2 shows a schematic cross-sectional view of a plasma etching apparatus in accordance with an embodiment of the present invention.
Figure 7:
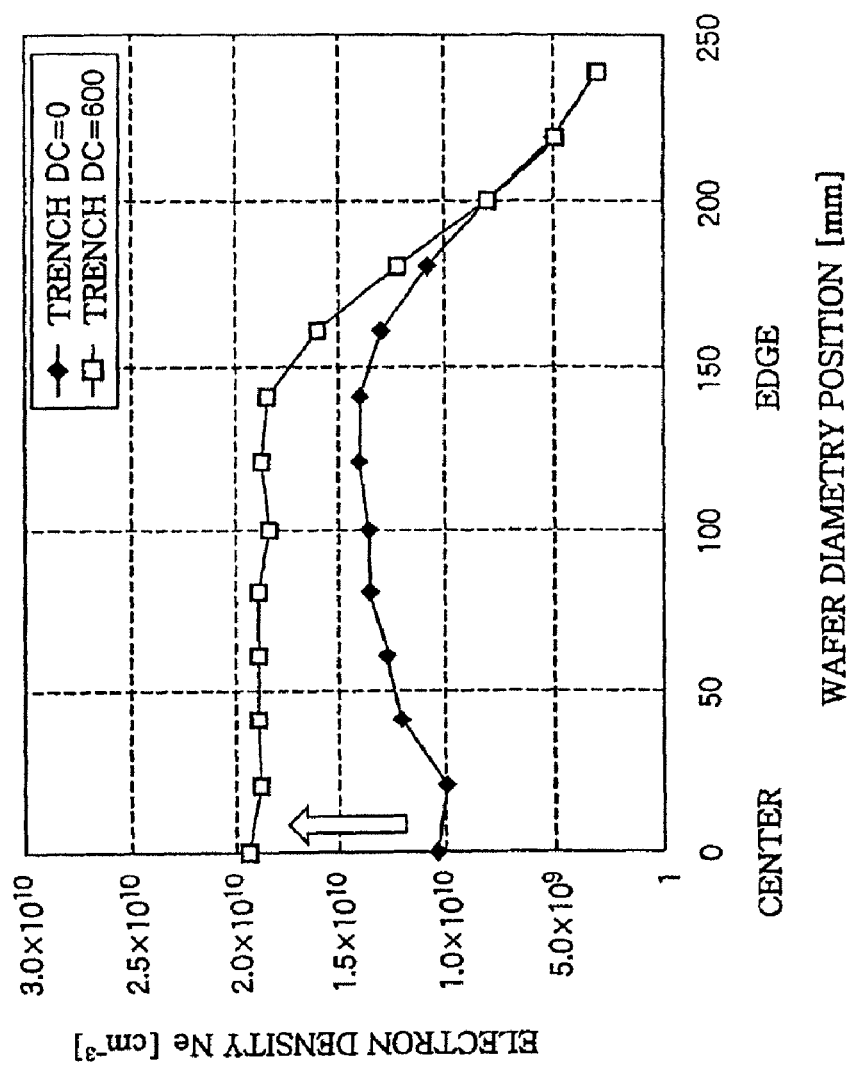
FIG. 7 is a graph showing measurement results of the electron density distribution in the wafer diameter direction in respective cases where the DC voltage is applied and where no DC voltage is applied under trench etching conditions.

In the plasma etching apparatus shown in FIG. 2, a semiconductor wafer W is loaded in the chamber 10 to be mounted on the susceptor 16. Further, the electron density (plasma density) in the wafer diameter direction was measured when no DC voltage is applied to the upper electrode 34 and when a DC voltage of −600 W is applied to the upper electrode 34 under the trench etching condition in which $CF_4$ gas, $CHF_3$ gas, Ar gas and $N_2$ gas are introduced as processing gases into the chamber 10, the pressure in the chamber 10 is set to 26.6 Pa, a first RF power of 40 MHz and a second RF power of 3.2 MHz are applied to the susceptor 16 serving as the lower electrode with 300 W and 1000 W, respectively. The results are shown in FIG. 7. As shown in FIG. 7, it has been confirmed that the electron density in the central portion is lower than that in the other portions when no DC voltage is applied, but the electron density in the central portion is increased by the application of a DC voltage to make the electron density uniform. Further, with the application of the DC voltage, the electron density was increased as a whole.

As described above, by controlling the DC voltage applied to the upper electrode 34, it is possible to effectively realize at least one of the sputtering function of the upper electrode 34, the plasma reduction function, the electron supplying function, the plasma potential controlling function, the electron density (plasma density) increasing function and the plasma density controlling function.

Heretofore, there were described the acting effects in a wide aspect of the case where a DC voltage is applied to the upper electrode 34.

In the present embodiment, as the plasma etching apparatus wherein a DC voltage is applied to the upper electrode, there is employed a plasma etching apparatus of a type of applying two RF powers of different frequencies to the lower electrode wherein a first RF power for generating a plasma and a second RF power for attracting ions are applied to the lower electrode. The advantages of the plasma etching apparatus of the type of applying two RF powers of different frequencies to the lower electrode, compared with other capacitively coupled plasma etching apparatus, are as follows.

First, by applying a RF power for generating a plasma to the lower electrode, the plasma is generated at a location closer to the wafer and the plasma is not diffused widely, thereby suppressing the dissociation of the processing gas. Accordingly, the etching rate for the wafer can be increased even under the condition that the pressure in the processing chamber is high and the plasma density is low. Further, the efficiency is high since a relatively high ion energy can be obtained even when the RF power for generating a plasma is of a high frequency. To the contrary, in an apparatus wherein the plasma generating RF power is applied to the upper electrode, the plasma is generated in the vicinity of the upper plasma, so that it is difficult to increase the etching rate for the wafer under the condition that the pressure in the processing chamber is high and the plasma density is low.

Further, the plasma generating RF power and the ion attracting RF power are individually applied to the lower electrode, so that it is possible to independently control the plasma generating function and the ion attraction function required for the plasma etching. In contrast, in an apparatus wherein a single frequency RF power is applied to the lower electrode, it is impossible to independently control the plasma generating function, thereby making it difficult to satisfy an etching condition requiring a very fine processing.

As described above, in the plasma etching apparatus of the type of applying two RF powers of different frequencies to the lower electrode wherein a plasma can be generated at a location close to the wafer to prevent the plasma from being diffused widely and the plasma generating function and the ion attracting function can be independently controlled, by applying a DC voltage to the upper electrode, the plasma etching apparatus can further have at least one of the sputtering function of the upper electrode, the plasma reduction function, the function of supplying electrons to the wafer, the plasma potential controlling function, the plasma density increasing function and the plasma density controlling function. Accordingly, it is possible to provide a plasma etching apparatus demonstrating a high performance suitable for a recent fine etching.

Further, the application of a DC voltage to the upper electrode 34 may be selectively conducted. In an etching condition that requires to apply a DC voltage to the upper electrode 34, the variable DC power source 50 and a relay switch 52 shown in FIG. 2 are turned on. In an etching condition that it is not particularly necessary to apply a DC voltage to the upper electrode 34, it is preferable to turn off the variable DC power source 50 and the relay switch 52.

Figure 8:
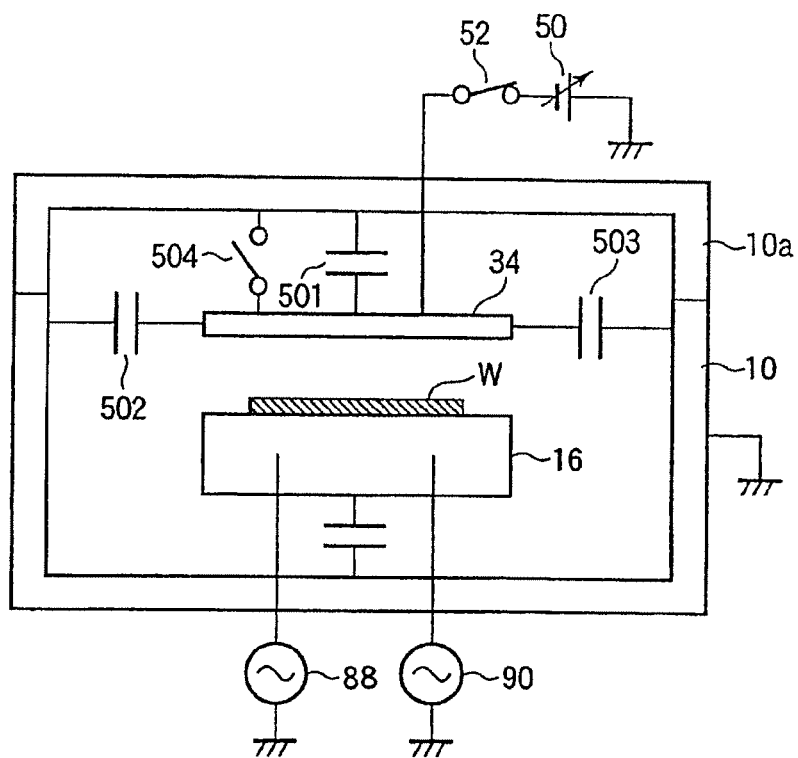
FIG. 8 is a schematic diagram showing respective electrical states of the upper electrode in the plasma etching apparatus shown in FIG. 2.

Furthermore, when a DC voltage is applied to the upper electrode 34, the application of the DC voltage to the upper electrode 34 becomes useless if the upper electrode 34 is grounded, and, therefore, the upper electrode 34 needs to be DC-floated. This is schematically illustrated in FIG. 8. Dielectric materials are actually provided at the locations of capacitors 501, 502 and 503 in FIG. 8, so that the upper electrode 34 is DC-floated through the dielectric materials with respect to the processing chamber 10 and the grounding conductor 10a. Further, the RF powers applied from the RF power supplies 88, 90 to the lower electrode 16 pass through a processing space to reach the upper electrode 34 and arrive via the capacitors 501, 502 and 503 at the processing chamber 10 and the grounding conductor 10a which are grounded.

Figure 9:
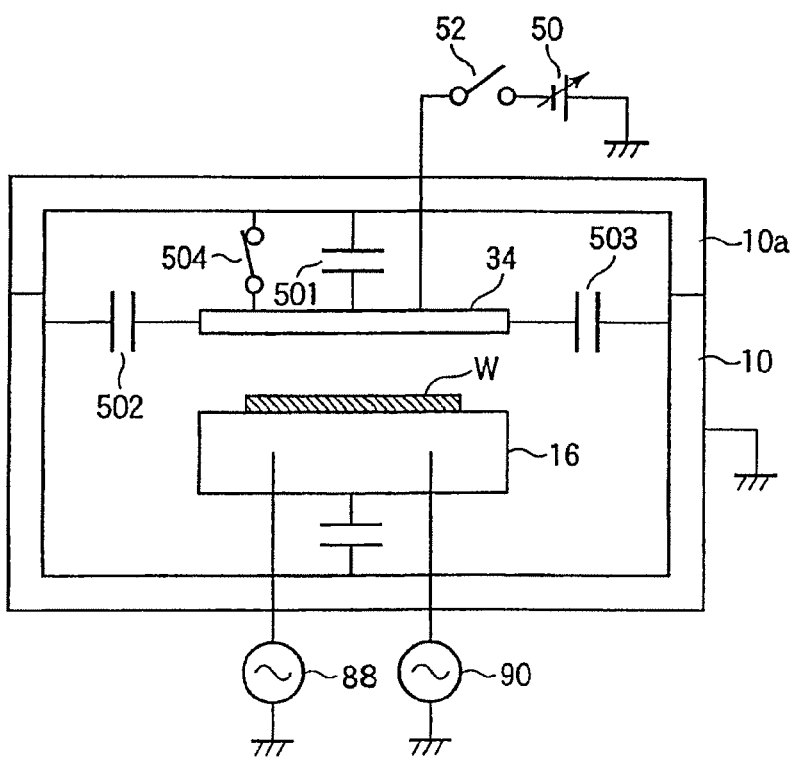
FIG. 9 is a schematic diagram showing respective electrical states of the upper electrode in the plasma etching apparatus shown in FIG. 2.

Further, in case no DC voltage is applied to the upper electrode 34 by turning off the variable DC power source 50 and the relay switch 52, the upper electrode may be configured such that it can be varied to a grounded state or a DC-floated state. In an example of FIG. 9, when no DC voltage is applied to the upper electrode 34, the upper electrode 34 is in the grounded state by short-circuiting the grounding conductor 10a and the upper electrode 34 by using a switch (variable unit) 504, but the upper electrode 34 may be in the DC-floated state by turning off the switch (variable unit) 504.

Figure 10:
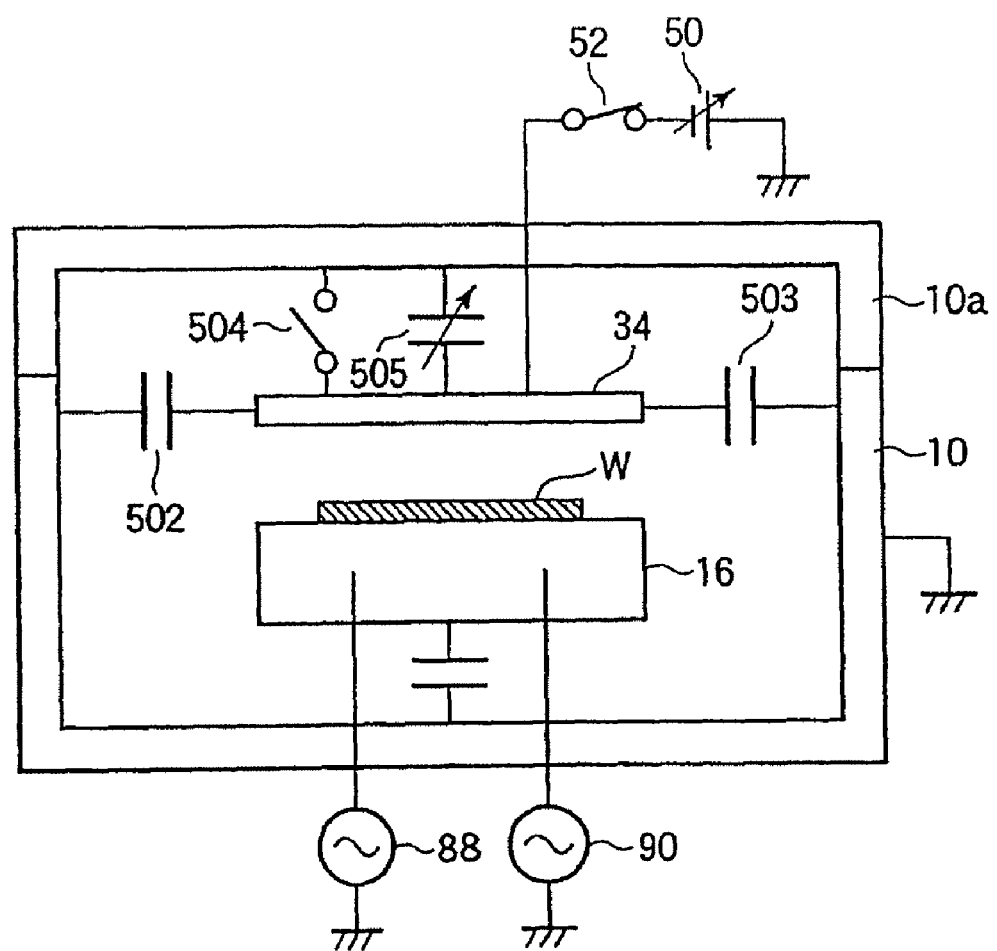
FIG. 10 is a schematic diagram showing respective electrical states of the upper electrode in the plasma etching apparatus shown in FIG. 2.

Further, as shown in FIG. 10, in place of the capacitor 501, a capacitor 505 whose capacitance can be electrically varied may be provided. In this way, it is possible to vary the potential of the upper electrode.

Figure 11:
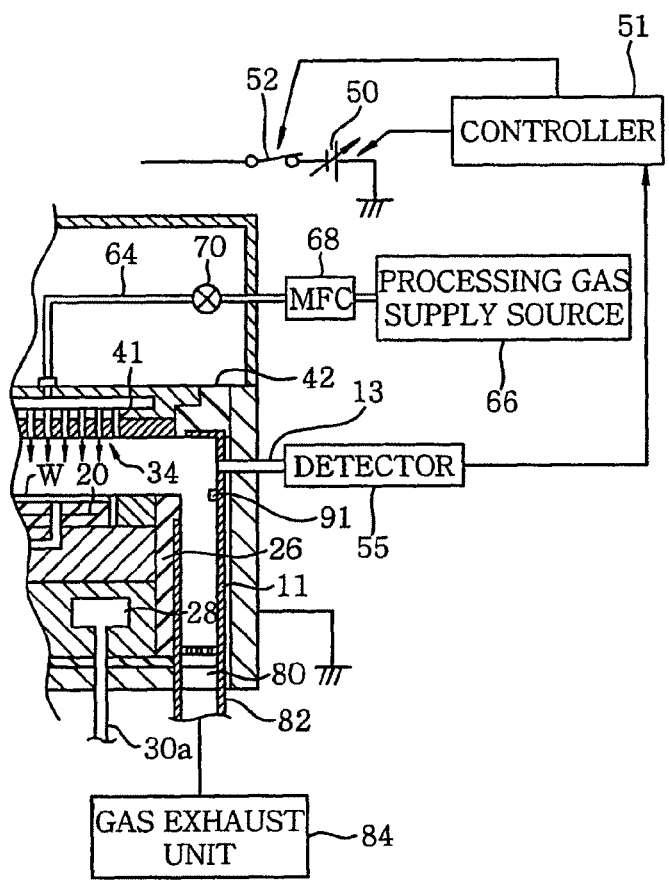
FIG. 11 illustrates a partial cross-sectional view showing a state in which a detector for detecting a plasma is installed in the plasma etching apparatus shown in FIG. 2.

Moreover, as shown in FIG. 11, by providing a detector 55 for detecting a plasma sate through, e.g., a plasma detecting window 13 such that the controller 51 controls the variable DC power source 50 based on a detection signal therefrom, it is possible to automatically apply a DC voltage that realizes effectively the aforementioned functions to the upper electrode 34. Further, the variable DC power source 50 may be controlled by the controller based on a detection signal from a detector for detecting a sheath thickness or an electron density.

Meanwhile, if a DC voltage is applied to the upper electrode 34, electrons are accumulated on the upper electrode 34 which may cause an abnormal discharge, e.g., between the inner wall of the chamber 10 and the upper electrode 34. In order to suppress such an abnormal discharge, in the present embodiment, there is provided on the deposition shield 11 on the side of the chamber wall a GND block (conductive member) 91 which is a part DC-grounded. The GND block is exposed to the plasma and is electrically connected to a conductive portion in the deposition shield 11. The current of the DC voltage applied from the variable DC power source 50 to the upper electrode 34 passes through the processing space to reach the GND block 91 and is grounded via the deposition shield 11. The GND block 91 is a conductive member and is preferably formed of a silicon-containing material such as Si, SiC and the like. Also, C may be used properly. The electrons accumulated on the upper electrode 34 can be released through the GND block 91, thereby preventing an abnormal discharge. The GND block 91 preferably has a protrusion length of 10 mm.

Figure 12:
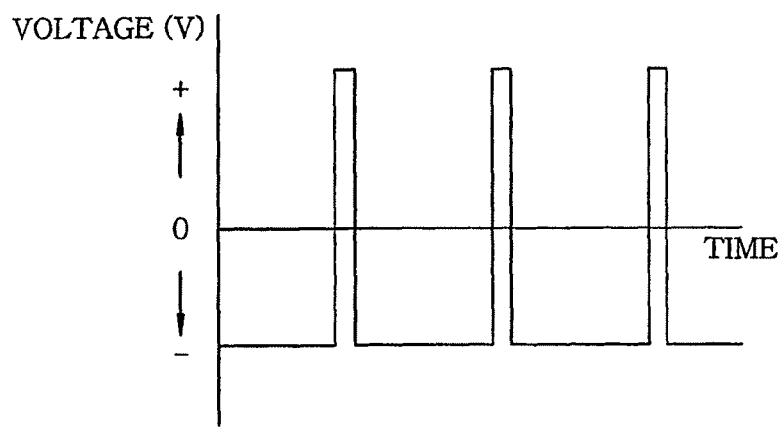
FIG. 12 presents a diagram showing a waveform for suppressing an abnormal discharge when a DC voltage is applied to the upper electrode in the plasma etching apparatus shown in FIG. 2.

Further, as another effective method of preventing the abnormal discharge, in case a DC voltage is applied to the upper electrode 34, ultra-short pulses of opposite polarity are periodically applied by using an appropriate means to be superimposed on the DC voltage as shown in FIG. 12, thereby neutralizing the electrons.

Figure 13:
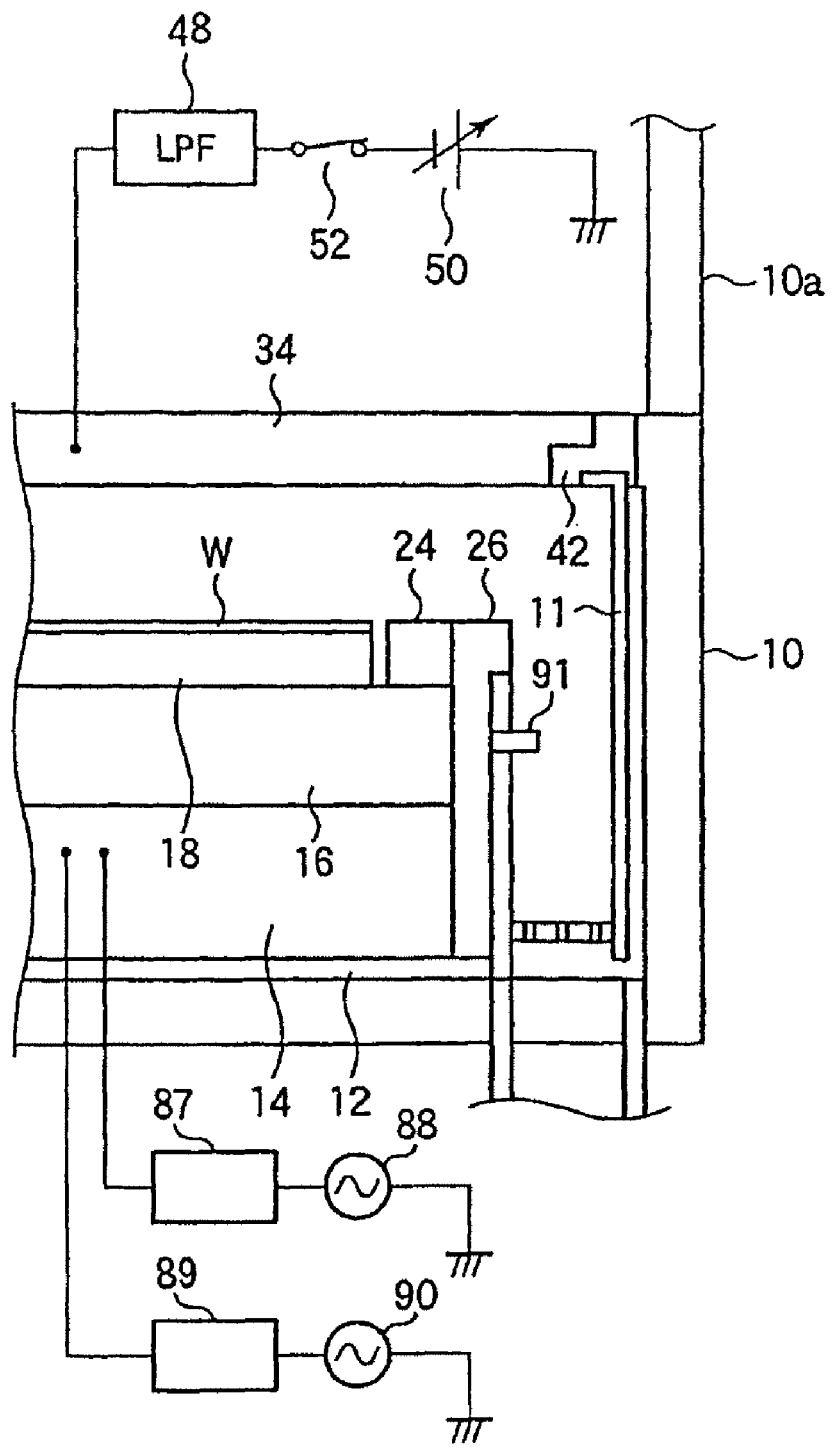
FIG. 13 depicts a schematic diagram showing another arrangement of a GND block.
Figure 14:
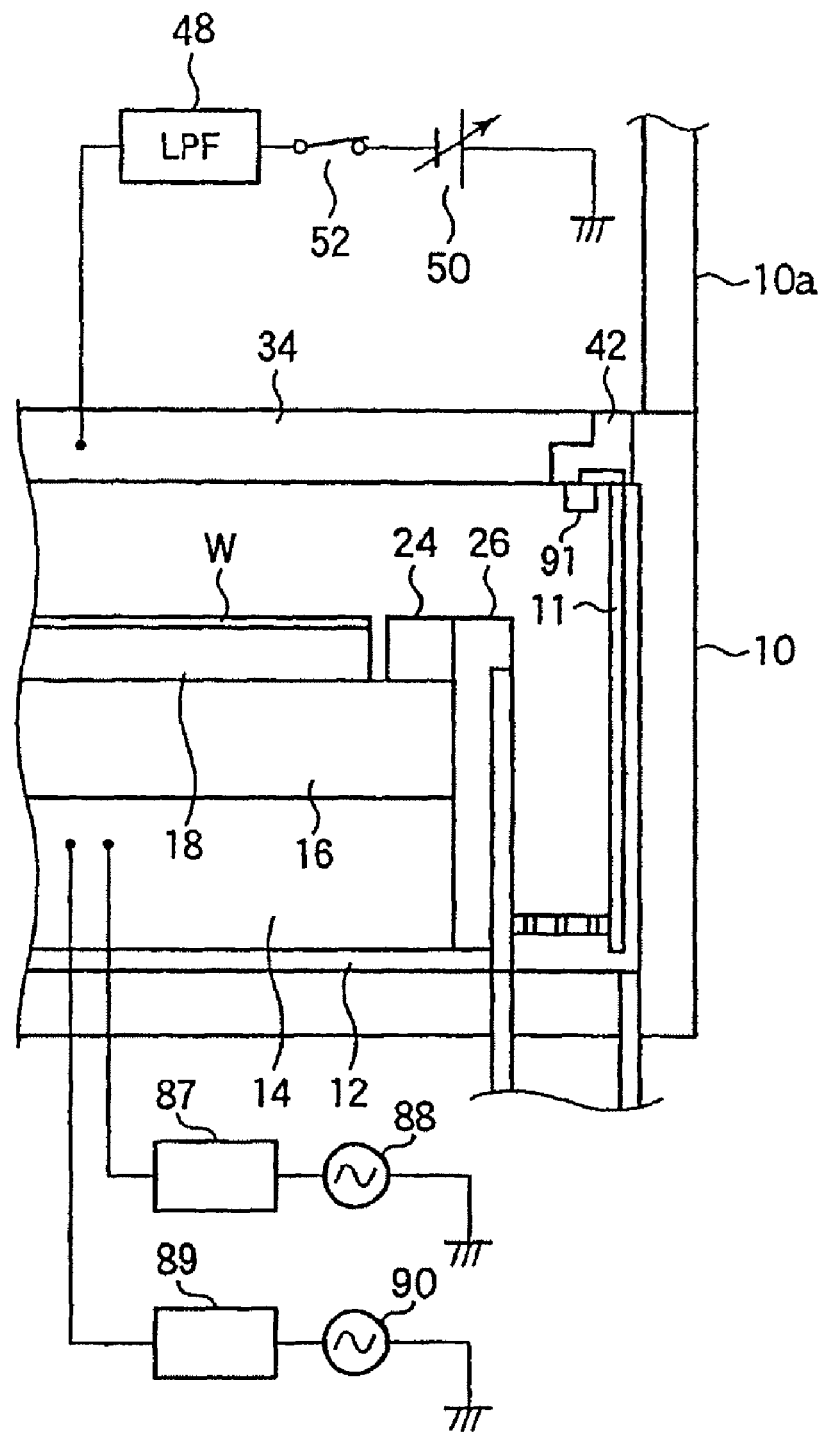
FIG. 14 sets forth a schematic diagram showing still another arrangement of the GND block.
Figure 15A:
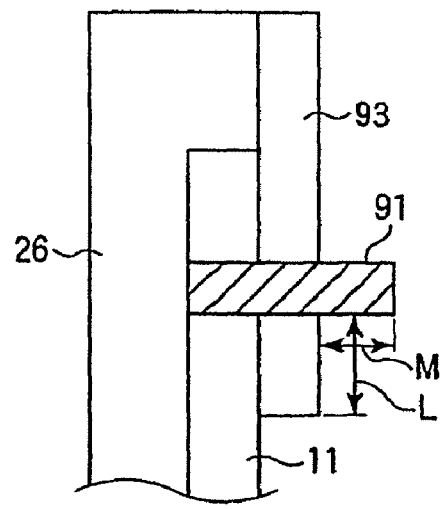
FIG. 15A is a schematic view for explaining an exemplary structure of the GND block that prevents any material attachment to the GND block.
Figure 15B:
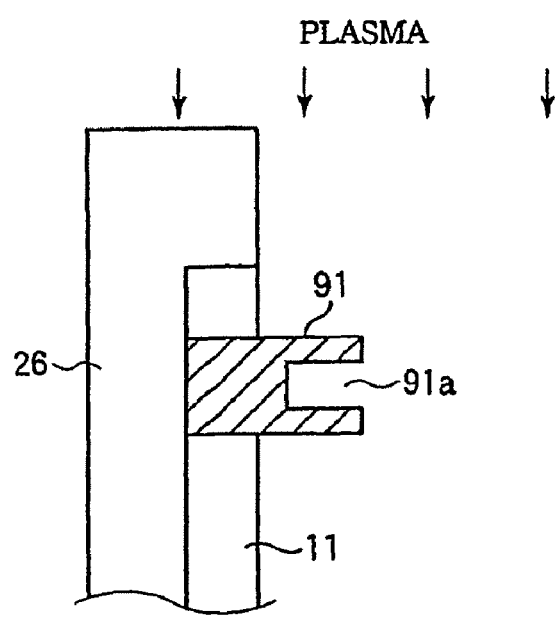
FIG. 15B is a schematic view for explaining an exemplary structure of the GND block that prevents any material attachment to the GND block.

The position of the GND block 91 is not limited to that shown in FIG. 2 as long as the GND block 91 is provided in the plasma generation region. For example, as shown in FIG. 13, the GND block 91 may be provided on the side of the susceptor 16, e.g., at the periphery of the susceptor 16. Further, as shown in FIG. 14, the GND block 91 may be provided near the upper electrode 34, for example, in a ring-shape at an outside of the upper electrode 34. Here, if $Y_2O_3$ and/or polymer coated on the deposition shield 11 are scattered to be attached on the GND block 91, the GND block 91 will not be DC-grounded and it will be difficult to achieve the abnormal discharge prevention effect. Therefore, it is important that the GND block 91 is provided at a location where $Y_2O_3$ and/or polymer coated on the deposition shield 11 are made to be difficult to be attached thereto. To that end, the GND block 91 is preferable to be located far from a member on which $Y_2O_3$ or the like is coated and parts adjacent thereto are preferably formed of Si or a Si-containing material such as quartz ($SiO_2$). For example, as shown in FIG. 15A, it is preferable to provide a Si-containing member 93 at the periphery of the GND block 91. In this case, a length L of a part of the Si-containing member 93 extended below the GND block 91 is preferably equal to or greater than the protrusion length M of the GND block 91. Furthermore, in order to prevent the function of the GND block 91 from being deteriorated due to the $Y_2O_3$ and/or polymer attached thereto, it is effective to make the GND bock 91 have a form with a recessed portion 91a as shown in FIG. 15B such that any scattered materials can hardly be attached thereto. In addition, it is also effective to make the surface area of the GND block 91 be increased such that $Y_2O_3$ and/or polymer are difficult to cover it. Moreover, a high temperature is known to be effective to suppress any attachment and the plasma generating RF power applied to the upper electrode 34 to generate the plasma will increase the temperature therearound. Accordingly, in terms of suppressing the attachment by increasing the temperature, the GND block 91 is preferably provided around the upper electrode 34 as shown in FIG. 14. In this case, it is particularly preferable to provide the GND block 91 in the ring-shape at an outside of the upper electrode 34 as shown in FIG. 14.

Hereinafter, by using, as the plasma etching apparatus wherein a DC voltage is applied to the upper electrode, the plasma etching apparatus of the type of applying two RF powers of different frequencies to the lower electrode wherein the plasma generating first RF power and the ion attracting second RF power are applied to the lower electrode, there will be described in detail a method for etching an organic film or an amorphous carbon film on the wafer W by using a mask containing silicon.

Figure 16A:
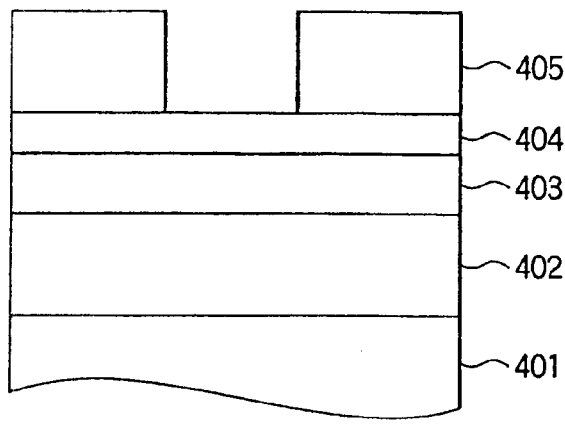
FIGS. 16A to 16C are schematic cross-sectional views of the wafer which is undergoing a process of an etching method in accordance with the present invention.
Figure 16B:
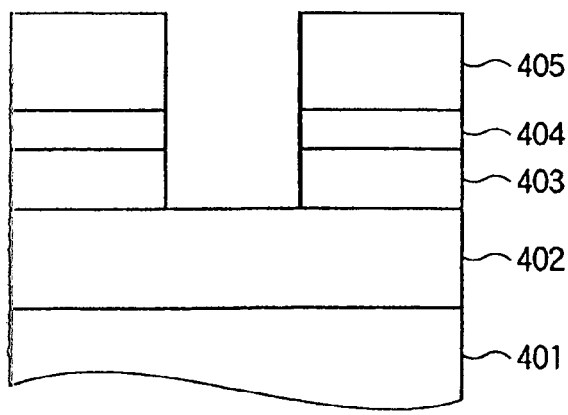
Figure 16C:
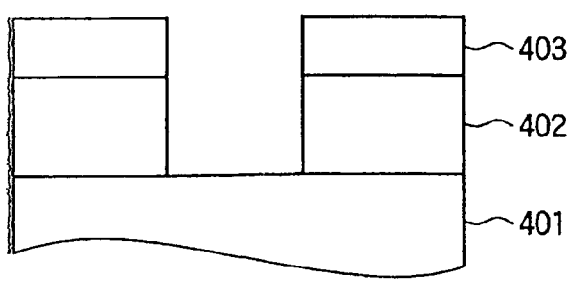

FIGS. 16A to 16C show schematic cross-sections of the structures of the wafer W processed by the etching method of the present invention. As shown in FIG. 16A, the wafer W includes a silicon substrate 401, an organic film 402 as an organic-based material film, a silicon oxy-nitride film (SiON film) 403 as an inorganic-based material film, and a BARC (bottom anti-reflection coating) 404 as an anti-reflection film, which are stacked in that order from the bottom. Further, there is formed on the BARC 404 an ArF resist film 405 as an etching mask that is patterned in a specified pattern.

The organic film 402 may be replaced with an amorphous carbon film. Furthermore, instead of the silicon oxy-nitride film 403, there may be employed a general material that is used as a typical hard mask such as a silicon-containing film, e.g., silicon oxide ($SiO_2$) film or silicon nitride ($Si_3N_4$) film. In addition, a silicon oxide film or a silicon nitride may be interposed between the silicon substrate 401 and the organic film 402.

For such a wafer W, the BARC 404 and the silicon oxy-nitride film 403 are etched by applying a first RF power from the first RF power supply 88 and a second RF power from the second RF power supply 90 to the susceptor 16 serving as the lower electrode while supplying $CF_4$ gas from the processing gas supply source 66 into the chamber 10. By doing so, as shown in FIG. 16B, recessed portions (recesses or holes) corresponding to the pattern of the ArF resist film 405 are formed.

Typical etching conditions at this time are as follows.
Pressure in chamber: 10 Pa
RF power (first/second): 400 W/400 W
Processing gas flow rate: $CF_4$ gas=180 sccm (mL/min)
Processing time: 30 sec
Back pressure (He gas: center/edge): 2000 Pa/4000 Pa
Temperature of upper electrode 34: 120° C.
Temperature of sidewall of chamber 10: 120° C.
Temperature of susceptor 16: 120° C.

Further, for the wafer structure shown in FIG. 16B, the first and the second RF power are applied to the lower electrode 16 and a DC voltage is applied from the DC power source 50 to the upper electrode 34 while supplying a processing gas not containing a CF-based gas, e.g., $O_2$ gas, from the processing gas supply source 66 into the chamber 10. In this case, the DC voltage applied to the upper electrode 34 is preferably set to be within a range from −100 V to −1500 V, more preferably −100 V to −1000 V, and most preferably −100 V to −600 V. By performing the etching process under such conditions, the organic film 402 in the recesses is etched and, at the same time, the ArF resist film 405 and the BARC 404 are etched while the silicon oxy-nitride film 403 serves as an etching stop layer. As a result, the wafer W has the structure shown in FIG. 16C.

As the processing gas that does not contain a CF-based gas when the organic film or the amorphous carbon film is etched by using a silicon-containing mask, there may be used a gaseous mixture of $O_2$ gas and another gas such as ($O_2$, $N_2$), ($O_2$, $N_2$, CO), ($O_2$, CO), ($O_2$, $CO_2$), ($O_2$, $CH_4$), or ($O_2$, $NH_3$), other than $O_2$ single gas. In this case, the same effects as in the case of $O_2$ gas can be exhibited.

Typical etching conditions when etching the organic film or the amorphous carbon film by using the silicon-containing mask are as follow.
Pressure in chamber: 1 Pa
RF power (first/second): 400 W/400 W
Processing gas flow rate: $O_2$ gas=150 sccm
Processing time: 100 sec
Back pressure (He gas: center/edge): 2000 Pa/4000 Pa
Temperature of upper electrode 34: 120° C.
Temperature of sidewall of chamber 10: 120° C.
Temperature of susceptor 16: 120° C.
DC voltage applied to upper electrode: −250 V As described above, for the wafer structure shown in FIG. 16B, in case the silicon oxy-nitride film 403 is used as a mask while the organic film 402 is etched, by applying the first and the second RF power to the lower electrode 16 and applying the DC voltage from the DC power source 50 to the upper electrode 34 while supplying a processing gas not containing a CF-based gas, e.g., $O_2$ gas, from the processing gas supply source 66 into the chamber 10, an etching rate of the organic film 402 can be increased and a shoulder portion of the silicon oxy-nitride film 403 can be prevented from being damaged (shoulder loss). Accordingly, the etching selectivity of the organic film 402 to the silicon oxy-nitride film 403 can be increased.

Figure 17:
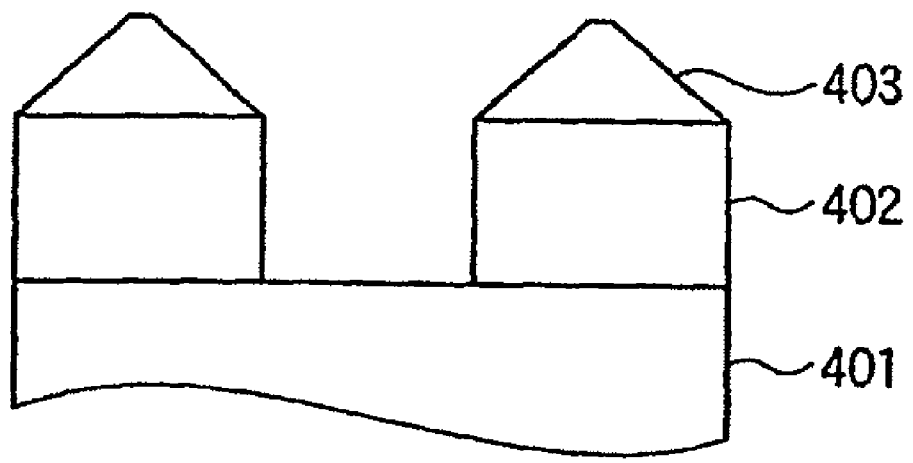
FIG. 17 is a schematic cross-sectional view of the wafer in a case where the etching is performed on the wafer having the structure shown in FIG. 16B while no DC voltage is applied to the upper electrode.

Here, with respect to the wafer structure shown in FIG. 16B, there will be described a case where no DC voltage is applied from the DC power source 50 to the upper electrode 34. In order to increase the etching rate of the organic film 402, the value of the first RF power needs to be increased. If the value of the first RF power is raised, the plasma density becomes greater to thereby increase the etching rate of the organic film 402 but at the same time a self bias voltage ($V_{dc}$) on the lower electrode 16 becomes increased, too. The increase of the self bias voltage means that the potential difference between the wafer W and the plasma space becomes greater, which makes the incident energy of ions in the plasma colliding with the silicon oxy-nitride film 403 increased, thereby increasing the damage thereon. In this case, as shown in FIG. 17, the portions of the silicon oxy-nitride film 403 adjacent to the recesses are particularly removed, so that the silicon oxy-nitride comes to have a mountain-shape, i.e., the shoulder portions thereof are damaged (shoulder loss). In other words, if the first RF power is increased, the etching rate of the organic film is increased but the etching selectivity of the organic film 402 to the silicon oxy-nitride film 403 becomes decreased.

On the other hand, in case a DC voltage is applied from the DC power source 50 to the upper electrode 34, the plasma density can be increased in accordance with the same principle as the aforementioned principle (see, paragraph Nos. [0052] and [0053]), so that the plasma density can be increased without raising the value of the first RF power. Further, since the value of the first RF power is not increased, the shoulder damage of the silicon oxy-nitride 403 due to the increase of the self bias voltage ($V_{dc}$) and hence the increase of the incident energy of ions in the plasma colliding with the silicon oxy-nitride film 403 can be prevented.

Hereinafter, there will be described the effects of the increase in the etching rate and the increase in the etching selectivity described above based on experimental results.

Figure 18A:
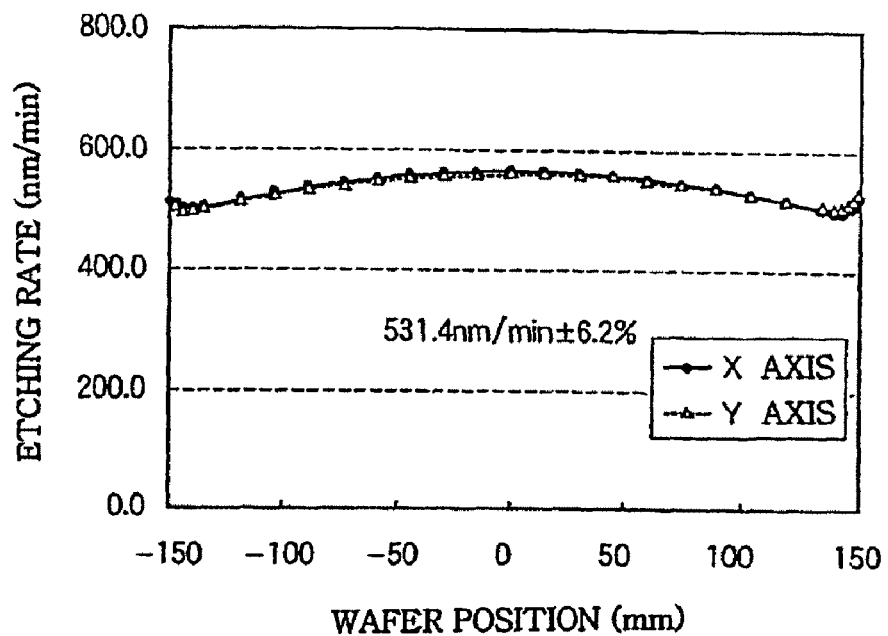
FIG. 18A is a graph showing respective etching rates at the time when a photoresist film is etched in a case where no DC voltage is applied to the upper electrode and in a case where a DC voltage of −250 V is applied to the upper electrode.
Figure 18B:
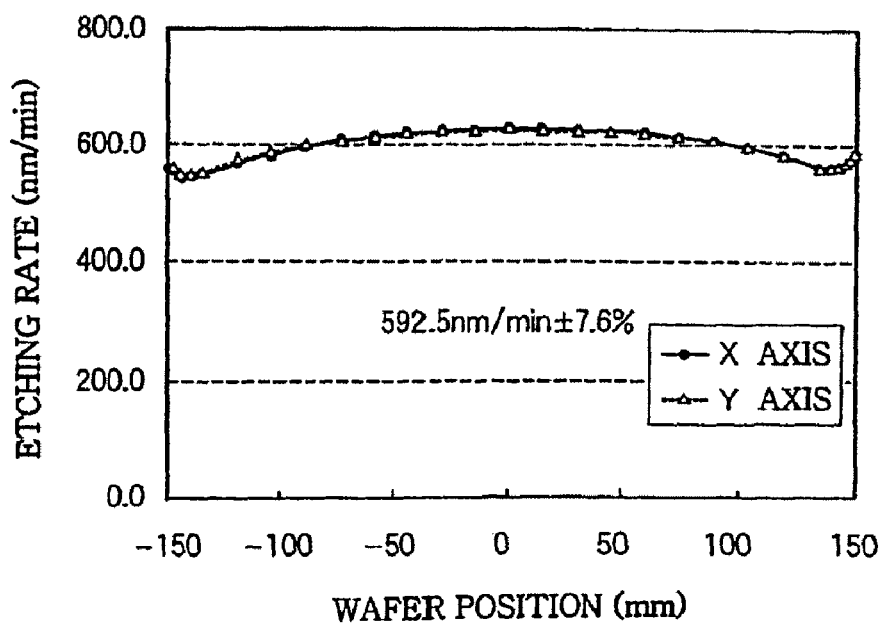
FIG. 18B is a graph showing respective etching rates at the time when a photoresist film is etched in a case where no DC voltage is applied to the upper electrode and in a case where a DC voltage of −250 V is applied to the upper electrode.
Figure 19A:
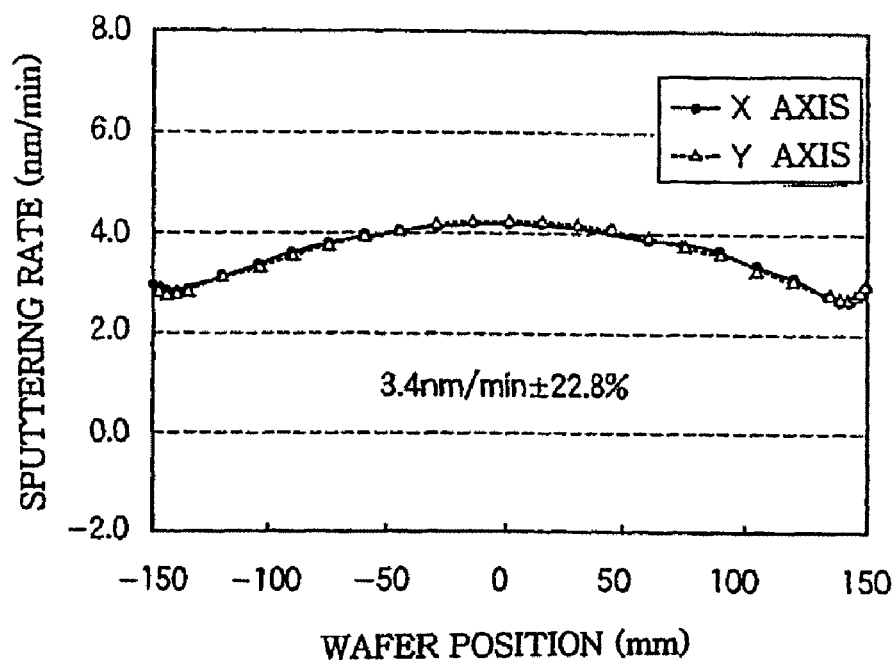
FIG. 19A is a graph showing respective sputtering rates at the time when a silicon oxide film is made to sputter in a case where no DC voltage is applied to the upper electrode and in a case where a DC voltage of −250 V is applied to the upper electrode.
Figure 19B:
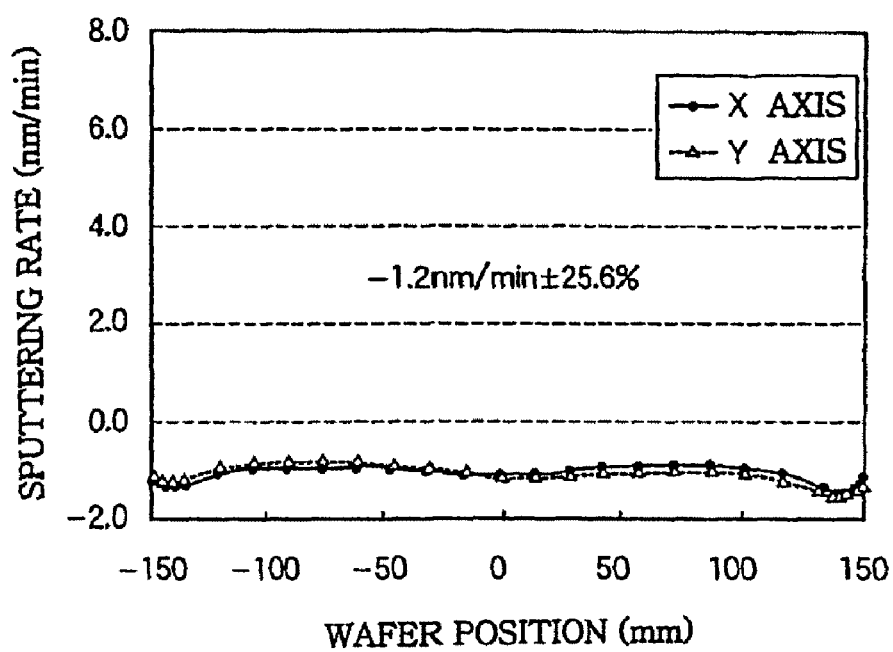
FIG. 19B is a graph showing respective sputtering rates at the time when a silicon oxide film is made to sputter in a case where no DC voltage is applied to the upper electrode and in a case where a DC voltage of −250 V is applied to the upper electrode.

FIGS. 18A and 18B are graphs showing an etching rate when a photoresist film is etched wherein the X-axis represents a wafer position (mm) and the Y-axis denotes the etching rate (nm/min). FIGS. 19A and 19B are graphs showing a sputtering rate when a silicon oxide film is sputtered (etched) wherein the X-axis represents a wafer position (mm) and the Y-axis denotes the sputtering rate (nm/min). In the cases of FIGS. 18A and 19A, no DC voltage is applied to the upper electrode, and in the cases of FIGS. 18B and 19B, a DC voltage of −250 V is applied to the upper electrode. Further, in FIG. 19B, the sputtering rate having a minus value means that deposits are deposited on the silicon oxide film without making the silicon oxide film sputter.

The etching conditions of the cases of FIGS. 18A, 18B and 19A, 19B are the same except for the processing time. The etching conditions are as follows.

(Etching Conditions)
Pressure in chamber: 1 Pa
RF power (first/second): 400 W/400 W
Processing gas flow rate: $O_2$ gas=150 sccm (mL/min)
Processing time (FIGS. 18A and 18B): 60 sec
Processing time (FIGS. 19A and 19B): 120 sec
Back pressure (He gas: center/edge): 2000 Pa/4000 Pa
Temperature of upper electrode 34: 120° C.
Temperature of sidewall of chamber 10: 120° C.
Temperature of susceptor 16: 120° C.

As can be seen from FIGS. 18A and 18B, by applying a DC voltage to the upper electrode 34, the etching rate of the photoresist film is increased. Further, as can be seen from FIGS. 19A and 19B, even though a DC voltage is applied to the upper electrode, the sputtering rate of the silicon oxide film is not increased (the silicon oxide film has deposits thereon without sputtering).

Since the etching conditions of FIGS. 18A, 18B and 19A, 19B are the same except for the processing time, it is possible to consider that the photoresist film in the FIGS. 18A and 18B and the silicon oxide film in FIGS. 19A and 19B can be substituted by the organic film 402 and the silicon oxy-nitride 403 shown in FIGS. 16A to 16C, respectively. Accordingly, in the specific case shown in FIGS. 16A and 16C, it can be considered that it has been experimentally proved that, by applying a DC voltage to the upper electrode 34, the etching rate of the organic film 402 can be increased and the etching selectivity of the organic film 402 to the silicon oxy-nitride 403 can also be increased.

Furthermore, as available frequencies of the first and the second RF power, for example, the first RF power may have a frequency of 13.56 MHz, 27 MHz, 40 MHz, 60 MHz, 80 MHz, 100 MHz, 160 MHz and the like and the second RF power may have a frequency of 380 KHz, 800 KHz, 1 MHz, 2 MHz, 3.2 MHz, 13.56 MHz and the like, so that they can be properly combined depending on the process.

While the invention has been shown and described with respect to the preferred embodiments, it will be understood by those skilled in the art that various changes and modification may be made without departing from the scope of the invention as defined in the following claims.

What is claimed is:

1. A plasma etching method for etching a substrate by using a plasma processing apparatus including an evacuable processing chamber that forms a process space to accommodate the substrate; an exhaust unit connected to an exhaust port of the processing chamber to vacuum-exhaust gas from inside the processing chamber; an exhaust plate interposed between the process space and the exhaust port to rectify a flow of exhaust gas; a first and a second electrode disposed to face each other in the processing chamber, the second electrode supporting the substrate; and a processing gas supply unit for supplying a processing gas into the processing chamber, the method comprising the steps of:
   etching an organic film or an amorphous carbon film on the substrate by using a silicon-containing mask wherein the etching is performed by applying a DC voltage to the first electrode from a DC power supply and applying a first and a second radio frequency power to the second electrode to convert the processing gas supplied from the processing gas supply unit into a plasma, the processing gas containing no CF-based gas and being supplied through gas injection holes in the first electrode being DC-floated with respect to a ground potential; and
   releasing a current caused by the DC voltage to a grounded conductive member provided in the processing chamber via the plasma.

2. The plasma etching method of claim 1, wherein the processing gas containing no CF-based gas is one of $O_2$ gas and a gaseous mixture of ($O_2$, $N_2$), ($O_2$, $N_2$, CO), ($O_2$, CO), ($O_2$, $CO_2$), ($O_2$, $CH_4$) or ($O_2$, $NH_3$).

3. The plasma etching method of claim 1, wherein the DC voltage is within a range from −100 V to −1500 V.

4. The plasma etching method of claim 3, wherein the DC voltage is within a range from −100 V to −1000 V.

5. The plasma etching method of claim 4, wherein the DC voltage is within a range from −100 V to −600 V.

6. A non-transitory computer-readable storage medium storing therein a control program, wherein the control program controls a plasma processing apparatus to perform the plasma etching method described in claim 1.

7. The plasma etching method of claim 1, wherein the conductive member comprises a portion disposed at a position to be exposed to the plasma above the exhaust plate within the processing chamber.

8. The plasma etching method of claim 1, the method further comprises the steps of:
   mounting a deposition shield to the processing chamber to prevent an etching byproduct from being attached to the processing chamber; and
   providing the conductive member on the deposition shield.

9. The plasma etching method of claim 1, wherein a Si-containing member is provided at the periphery of the conductive member.

10. The plasma etching method of claim 1, wherein the conductive member has a recessed portion.

11. The plasma etching method of claim 9, wherein the conductive member is provided around the first electrode.

12. The plasma etching method of claim 1, the method further comprises the step of:
   periodically applying pulses of opposite polarity to be superimposed on the DC voltage when applying the DC voltage to the first electrode.

13. The plasma etching method of claim 1, wherein the processing gas containing no CF-based gas is one of ($O_2$, $N_2$, CO), ($O_2$, CO), ($O_2$, $CO_2$), ($O_2$, $CH_4$) and ($O_2$, $NH_3$).

14. The plasma etching method of claim 1, wherein the silicon-containing mask comprises at least one of a silicon oxide, a silicon nitride, and a silicon oxynitride.

15. The plasma etching method of claim 1, wherein the first electrode is DC-floated through a dielectric material with respect to the processing chamber.

16. The plasma etching method of claim 1, wherein the plasma processing apparatus further includes a grounding conductor having a sidewall and an upper ceiling wall, the sidewall being upwardly extended from a sidewall of the processing chamber to a position higher than the first electrode, and wherein the first electrode is DC-floated through a dielectric material with respect to the processing chamber and the grounding conductor.

* * * * *